United States Patent [19]

Komuro

[11] Patent Number: 5,610,855
[45] Date of Patent: Mar. 11, 1997

[54] MULTI-VALUED SEMICONDUCTOR MEMORY DEVICE

[75] Inventor: Toshio Komuro, Tokyo, Japan

[73] Assignee: NEC Corporation, Tokyo, Japan

[21] Appl. No.: 576,574

[22] Filed: Dec. 21, 1995

[30] Foreign Application Priority Data

Dec. 26, 1994 [JP] Japan ................... 6-322661

[51] Int. Cl.$^6$ ................................ G11C 11/24
[52] U.S. Cl. .................. 365/149; 365/207; 365/210
[58] Field of Search ..................... 365/149, 145, 365/222, 203, 210, 189.01, 207

[56] References Cited

FOREIGN PATENT DOCUMENTS 62-95796   5/1987   Japan.
63-195896  8/1988   Japan.
1196791    8/1989   Japan.

*Primary Examiner*—David C. Nelms
*Assistant Examiner*—F. Niranjan
*Attorney, Agent, or Firm*—Sughrue, Mion, Zinn, Macpeak & Seas

[57] ABSTRACT

In order to provide a multi-valued DRAM with an access time comparable to ordinary binary DRAMs, a potential difference generated by a memory cell between a pair of bit-lines is delivered to N−1 sets of sense amplifiers. Each delivered potential difference is shifted by a predetermined value for each sense amplifier for classifying the potential difference into N levels. A refreshing potential for the memory cell is obtained from outputs of the sense amplifiers activated with sense amplifier activating signals having potentials predetermined for each sense amplifier.

5 Claims, 23 Drawing Sheets

FIG.10 (A)

| term | S1 initial value Vs | t1 – t2 differential potential | | t3 – t4 shifted potential | | t4 – t5 – logic of sense amplifier | | |
|---|---|---|---|---|---|---|---|---|
| | | B11, D1 D2, D3 | B12, D1B D2B, D3B | D2 | D3B | SA1 | SA2 | SA3 |
| a | 5 | 2.81 | 2.5 | 2.61 | 2.3 | 1 | 1 | 1 |
| b | 3.33 | 2.6 | 2.5 | 2.4 | 2.3 | 1 | 0 | 1 |
| c | 1.67 | 2.4 | 2.5 | 2.2 | 2.3 | 0 | 0 | 1 |
| d | 0 | 2.19 | 2.5 | 1.99 | 2.3 | 0 | 0 | 0 |

(potential unit: V)

FIG.10 (B)

| term | t4 – t7 output of sense amplifier | | | t5 – t6 transistor | | connection with B12 | t7 potential of bit-line | | rewrite potential S1 |
|---|---|---|---|---|---|---|---|---|---|
| | D1 | D2 | D3 | Q9 | Q10 | | B11 | B12 | |
| a | 5 | 5 | 3.33 | ON | OFF | D2 | 5 | 5 | 5 |
| b | 5 | 1.67 | 3.33 | ON | OFF | D2 | 5 | 1.67 | 3.33 |
| c | 0 | 1.67 | 3.33 | OFF | ON | D3 | 0 | 3.33 | 1.67 |
| d | 0 | 1.67 | 0 | OFF | ON | D3 | 0 | 0 | 0 |

(potential unit: V)

| | logic (potential) of sense amplifier | | | AD converter output | | | connection with IOT2 | output data | |
|---|---|---|---|---|---|---|---|---|---|
| | SA1 (D1) | SA2 (D2) | SA3 (D3) | R1 | R2 | R3 | | IOT1 | IOT2 |
| a | 1 (5) | 1 (5) | 1 (3.33) | 1 | 1 | 1 | R2 | 1 | 1 |
| b | 1 (5) | 0 (1.67) | 1 (3.33) | 1 | 0 | 1 | R2 | 1 | 0 |
| c | 0 (0) | 0 (1.67) | 1 (3.33) | 0 | 0 | 1 | R3 | 0 | 1 |
| d | 0 (0) | 0 (1.67) | 0 (0) | 0 | 0 | 0 | R3 | 0 | 0 |

(potential unit: V)

FIG.11 (A)

|   | input data | | logic (potential) of sense amplifier | | | connection with B12 | potential of bit-line | | write potential |
|---|---|---|---|---|---|---|---|---|---|
|   | IOT1 | IOT2 | SA1 (D1) | SA2 (D2) | SA3 (D3) |   | B11 | B12 | Vs |
| a | 1 | 1 | 1 (5) | 1 (5) | 1 (3.33) | D2 | 5 | 5 | 5 |
| b | 1 | 0 | 1 (5) | 0 (1.67) | 0 (0) | D2 | 5 | 1.67 | 3.33 |
| c | 0 | 1 | 0 (0) | 1 (5) | 1 (3.33) | D3 | 0 | 3.33 | 1.67 |
| d | 0 | 0 | 0 (0) | 0 (1.67) | 0 (0) | D3 | 0 | 0 | 0 |

(potential unit: V)

| term | initial value | | t1 – t3 differential potential | | t3 – t4 shifted potential | | t4 – t5 logic of sense amplifier | | |
|---|---|---|---|---|---|---|---|---|---|
| | S1 (Vs1) | S2 (Vs2) | B11, D1, D2, D3 | B12, D1B, D2B, D3B | D2 | D3B | SA1 | SA2 | SA3 |
| α | 0 | 5 | 1.95 | 3.05 | 1.21 | 2.3 | 0 | 0 | 0 |
| β | 0 | 1.67 | 2.3 | 2.68 | 1.57 | 1.95 | 0 | 0 | 1 |
| γ | 5 | 3.33 | 2.68 | 2.3 | 1.95 | 1.57 | 1 | 0 | 1 |
| δ | 5 | 0 | 3.05 | 1.95 | 2.3 | 1.21 | 1 | 1 | 1 |

(potential unit: V)

FIG.18 (B)

| term | t4 – t6 output of sense amplifier | | | | | t5 – t6 transistor | | t5 – t6 connection with B12 | t5 – t6 rewrite potential | |
|---|---|---|---|---|---|---|---|---|---|---|
| | D1 / D1B | D2 | D2B | D3 | D3B | Q9 | Q10 | | B11 / S1 | B12 / S2 |
| α | 0 | 5 | 0 | 3.33 | 1.67 | 5 | OFF | ON | D3B | 0 | 5 |
| β | 0 | 5 | 0 | 3.33 | 5 | 1.67 | OFF | ON | D3B | 0 | 1.67 |
| γ | 5 | 0 | 0 | 3.33 | 5 | 1.67 | ON | OFF | D2B | 5 | 3.33 |
| δ | 5 | 0 | 3.33 | 0 | 5 | 1.67 | ON | OFF | D2B | 5 | 0 |

(potential unit: V)

|  | logic (potential) of sense amplifier | | | AD converter output | | | connection with IOT2 | output data | |
|---|---|---|---|---|---|---|---|---|---|
|  | SA1 (D1) | SA2 (D2) | SA3 (D3) | R1 | R2 | R3 |  | IOT1 | IOT2 |
| α | 0 (0) | 0 (0) | 0 (1.67) | 0 | 0 | 0 | R3 | 0 | 0 |
| β | 0 (0) | 0 (0) | 1 (5) | 0 | 0 | 1 | R3 | 0 | 1 |
| γ | 1 (5) | 0 (0) | 1 (5) | 1 | 0 | 1 | R2 | 1 | 0 |
| δ | 1 (5) | 1 (3.33) | 1 (5) | 1 | 1 | 1 | R2 | 1 | 1 |

(potential unit: V)

FIG.19 (A)

| | input data | | logic (potential) of sense amplifier | | | connection with B12 | write potential | |
|---|---|---|---|---|---|---|---|---|
| | IOT1 | IOT2 | SA1 (D1) | SA2 (D2) | SA3 (D3) | | S1 B11 | S2 B12 |
| α | 0 | 0 | 0 (0) | 0 (0) | 0 (1.67) | D3B | 0 | 5 |
| β | 0 | 1 | 0 (0) | 1 (3.33) | 1 (5) | D3B | 0 | 1.67 |
| γ | 1 | 0 | 1 (5) | 0 (0) | 0 (1.67) | D2B | 5 | 3.33 |
| δ | 1 | 1 | 1 (5) | 1 (3.33) | 1 (5) | D2B | 5 | 0 |

(potential unit: V)

FIG.19 (B)

MULTI-VALUED SEMICONDUCTOR MEMORY DEVICE

BACKGROUND OF THE INVENTION

This invention relates to a semiconductor memory device, and more particularly to a multi-valued DRAM wherein multi-valued information is stored in a memory cell instead of binary information.

Memory capacity of the DRAM has been steadily increasing supported by the development of micro-technologies or hyper-integration-technologies. And, besides these structural exertions for microscopic integration, there have been also proposals to materialize a large scale DRAM by storing multi-valued information, quaternary information for example, in a memory cell.

As examples of the multi-valued DRAM, there are devices disclosed in Japanese patent applications laid open in Provisional Publications No. 95796/'87 (to be called a first example), No. 195896/'88 (to be called third example).

Outlines of these prior examples are briefly described in the following paragraphs.

In the first example, N-valued information is stored in a conventional type cell with a transistor and a capacitor as used usually in a DRAM for storing binary information. For reading-out the information, a stepping-up wave is supplied to a word-line and the differential potential detected on a bit-line is compared with one after another of N−1 reference potentials. For writing the information, stepping-down wave of N stages is recorded according to contents of the N registers storing the read-out information.

In the second example, for shortening a write time, there are provided N−1 resisters, N−2 capacitors having a same capacitance with the capacitance of a bit-line and charged according to contents of the resisters, and switching means which connect the N−2 capacitors to a bit-line for writing the information at once without using stepping-down wave.

In the third example, for shortening a read-out time, there is proposed a DRAM composed of multi-valued cells which operate on a new principle quite different from the first or the second example. The DRAM comprises a first bit-line pair, a second bit-line pair each bit-line of which has a half capacitance of a bit-line of the first bit-line pair, a first and a second sense amplifier for amplifying differential potentials detected between two bit-lines of the first and the second bit-line pair respectively, three pairs of dummy memory cells for generating reference potentials to be referred to by the sense amplifiers, and two pairs of auxiliary dummy cells for arranging capacitance differences.

A read-out operation of the third example is described theoretically.

First, by a selected memory cell, a differential potential is charged between two bit-lines of a first and second bit-line pairs connected with each other at the moment. Then the first bit-line pair is insulated from the second bit-line pair and the first sense amplifier amplifies the differential potential between the first bit-line pair sensing whether the differential potential corresponds to one of higher two values or lower two values of the four values storable in the memory cell referring to the first reference potential VR1 pre-charged by the first pair of dummy memory cells.

Then, the amplified potential is transferred to the second pair of dummy memory cells for generating a second referential potential VR2 together with a charge stored in the third pair of dummy memory cells when the differential potential corresponds to one of the higher two values, or a third reference potential VR3 when the differential potential corresponds to one of the lower two values. The reference potential VR2 or VR3 is referred to by the second sense amplifier for discriminating to which the differential potential remaining between the second bit-line pair corresponds of the four values storable in the memory cell.

The merits of the third example compared with the first or the second example consist in that it is composed of extended technologies of the ordinary binary DRAM and that no stepping wave is needed for write operation nor read-out operation, shortening both write and read-out times substantially.

The third example, however, has a problem that the read-out time remains still rather long compared with the ordinary binary DRAM because serial two discriminations by the sense amplifiers are necessary together with a transformation of the amplified potential between the pairs of dummy cells for charging the second referential potential.

Further, all of these three examples store N-valued information in a memory cell of a transistor and a capacitor, and so, have a problem of a decrease in operational margin because of the diminution of potential differences to be detected by sense amplifiers, resulting from the decrease of storable charge par bit in a memory cell with the reduction of sours voltages.

Suppose an example shown in FIG. 20 (A) composed of a bit-line B11 and a memory cell M1 with a transistor Q1 and a memory capacitor C1. Defining Cb as the capacitance of the bit-line B11, Cs as the capacitance of the memory capacitor C1, Vs as an initial potential of the node S1 of the memory cell M1, and Vh as a potential of the opposite electrode of the node S1, a following equation is obtained when the potential of the bit-line changes from Vi to Vx by stimulating a word-line WL1.

$$Cb \cdot Vi + Cs(Vs-Vh) = Cb \cdot Vx + Cs(Vx-Vh)$$

From the equation, Vx is represented as;

$$Vx=(Cb \cdot Vi+Cs \cdot Vs)/(Cb+Cs) \qquad (1)$$

Concrete examples of the potential Vx will be calculated, assuming that the source voltage Vcc is 5 V, Vi=2.5 V, Cb=350 fF and Cs=50 fF using the values described in the third example.

When the initial potential Vs of the node S1 has the maximum value of 5 V, Vx=2.81 V and when it has the minimum value of 0 V, Vx=2.19 V. For storing four valued information, for example, in a memory cell M1 with a transistor and a capacitor, two other initial values should be defined. When they are Vcc/3 (1.67 V) and 2 Vcc/3 (3.33 V), the corresponding values of Vx become 2.4 V and 2.6 V respectively.

FIG. 20 (B) illustrates the relation among the four values (a), (b), (c) and (d) of Vx thus obtained and the referential potentials VR1, VR2 and VR3 referred to by the sense amplifiers of the third prior example. The potential difference between VR1 and (b) or (c), VR2 and (a) or (b) and VR3 and (c) or (d) is about 100 mV. This is an example and the values of (b) and (c) of Vs or the values of VR1, VR2 and VR3 might be shifted, but no difference can be enlarged without reducing another difference. And, to reduce the source voltage Vcc, the differences must be reduced still more.

SUMMARY OF THE INVENTION

Therefore, a primary object of the present invention is to provide a multi-valued semiconductor memory device with shorter access times including read-out times. Another important object is to provide a multi-valued semiconductor memory device having a larger operating margin for a sense amplifier even with a low source voltage.

In order to achieve the objects, a semiconductor memory device of the present invention has a plurality of bit-memory units. Each of the bit-memory units comprises:

a first and a second bit-lines;

a plurality of memory cells, each of the memory cells having a memory capacitor for storing a-charge which generates a differential potential between the first and the second bit-lines and is recharged with potentials of the first and the second bit-lines when a word-line is charged;

at least two sets of means for generating a read-out potential, each of the at least two sets of means for generating a read-out potential having a first and a second in-out terminal and a sense amplifier which discriminates a potential difference between the first and the second in-out terminals and turns to logic '1' by charging the first in-out terminal with a potential of a positive sense amplifier activating signal and the second in-out terminals with a potential of a negative sense amplifier activating signal in case the first in-out terminal is at a higher potential than the second in-out terminal, and to logic '0' by charging the first in-out terminal with the potential of the negative sense amplifier activating signal and the second in-out terminals with the potential of the positive sense amplifier activating signal in case the first in-out terminal is at a lower potential than the second in-out terminal when activated by the positive and the negative sense amplifier activating signals, and each except one of the at least two sets of means for generating a read-out potential having a potential shift capacitor for shifting one of potentials of the first and the second in-out terminal of the each except one by a fixed value to lower side when a potential shift control signal is turned to low level;

a data transfer control circuit for connecting each of the first and the second bit-lines to each of the first and the second in-out terminals of each of the at least two sets of means for generating a read-out potential for transferring the differential potential to the at least two sets of means for generating a read-out potential when controlled with transfer control signals, and connecting each of two in-out terminals of the first and the Second in-out terminals of the at least two sets of means for generating a read-out potential to each of the first and the second bit-lines for recharging the memory capacitor in accordance with an ensemble of logic of the sense amplifier of each of the at least two sets of means for generating a read-out potential when controlled with the transfer control signals;

an AD converter for generating a set of output data, each of the set of output data corresponding to logic of the sense amplifier of each of the at least two sets of means for generating a read-out potential;

an output buffer circuit for outputting parallel binary output data to I/O terminals by converting the set of output data; and means for buffering and DA converting parallel binary input data from the I/O terminals to a set of input data, each of the set of input data being supplied to the first and the second in-out terminals of each of the at least two sets of means for generating a read-out potential for controlling logic of the sense amplifier of each of the at least two sets of means for generating a read-out potential in accordance with the parallel binary input data.

In an embodiment of the invention:

the first and the second bit-lines are pre-charged with a potential of a middle reference voltage by a pre-charge circuit when a pre-charge control signal is at high level;

an electrode of the memory capacitor is connected to the middle reference voltage and the other electrode of the memory capacitor is connected through a transistor to one of the first and the second bit-line when the word-line is at high level;

the differential potential is transferred through the data transfer control circuit to each of the at least two sets of means for generating a read-out potential when a first and one of a second and a third transfer control signals are at high level after the word-line is turned to high level, the second transfer control signal being at high level in case the memory capacitor is connected to the first bit-line and the third transfer control signal being at high level in case the memory capacitor is connected to the second bit-line;

the potential shift control signal is turned to high level after the at least two sets of means for generating a read-out potential are separated from the first and the second bit-lines by turning the first and the one of the second and the third transfer control signals to low level;

the second transfer control signal is turned to high level in case the memory capacitor is connected to the first bit-line while the third transfer control signal is turned to high level in case the memory capacitor is connected to the second bit-line for controlling the data transfer control circuit for recharging the memory capacitor after the sense amplifiers of the at least two sets of means for generating a read-out potential are activated; and a write potential for recharging the memory capacitor is obtained by unifying two potentials of the first and the second bit-lines after the first and the second bit-lines are separated from the at least two sets of means for generating a read-out potential by the data transfer control circuit by turning one at high level of the second and the third transfer control signals to low level.

In the embodiment, therefore, with N sets of means for generating a read-out potential, for example, N+1 levels of a charge stored in an ordinal memory cell of a capacitor and a transistor can be discriminated by arranging properly the potential shift values of the N sets of means for generating a read-out potential.

And a read-out time equivalent to that of ordinal binary DRAMs is obtained, as the differential potential of the first and the second bit-lines generated with the memory cell is transferred to the sense amplifiers at once and sensed at which level by a cooperation of the sense amplifiers for outputting as binary data. And a memory cell refreshment is performed with a refreshing potential obtained simply by transferring the potentials generated by the sense amplifiers to the first and the second bit-lines and unifying them, providing a write time equivalent to that of ordinary DRAMs.

In another embodiment of the invention:

the first and the second bit-lines are pre-charged with a potential of a middle reference voltage by a pre-charge circuit when a pre-charge control signal is at high level;

a first electrode of the memory capacitor is connected through a transistor to the first bit-line when the word-line is at high level and a second electrode of the memory capacitor is connected through another transistor to the second bit-line when the word-line is at high level;

the differential potential is transferred to each of the at least two sets of means for generating a read-out potential through the data transfer control circuit when a first and a second transfer control signals are at high level after the word-line is turned to high level;

the potential shift control signal is turned to high level after the at least two sets of means for generating a read-out potential are separated from the first and the second bit-lines by turning the first and the second transfer control signals to low level;

the second transfer control signal is turned to high level for controlling the data transfer control circuit for recharging the memory capacitor after the sense amplifiers of the at least two sets of means for generating a read-out potential are activated; and a first write potential for recharging the first electrode is obtained from a potential of the first bit-line and a second write potential for recharging the second electrode is obtained from a potential of the second bit-lines.

In the embodiment, 4(Cb+Cs)/(Cb+Cs) times, or about 3.7 times in an example, of the potential difference for the sense amplifier can be obtained compared with the third prior example with a memory cell composed of two transistor and a capacitor driven by same source voltage, where Cb is the capacitance of a bit-line and Cs is the capacitance of a memory cell, and a still faster memory cell refreshment is performed compared with the previous embodiment as unifying operation of the potentials of the bit-lines is eliminated.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

FIG. 3 (B) is a circuit diagram of a column switch circuit in FIG. 1.

FIG. 4 (B) is a circuit diagram of the input buffer 5 of FIG. 1.

FIG. 10 (A) shows a first part of a table illustrating potentials of each part, logics of the sense amplifiers and a part of control of the data transfer circuit 5 in the embodiment of FIG. 1.

FIG. 10 (B) shows the latter part of the table shown in FIG. 10 (A).

FIG. 11 (A) shows a table illustrating relations among logics of the sense amplifiers, sets of output data and parallel binary output data in the embodiment of FIG. 1.

FIG. 11 (B) shows a table illustrating relations among parallel binary input data, logics of the sense amplifiers, a part of control of the data transfer circuit 5 and potentials of each part in the embodiment of FIG. 1.

FIG. 18 (A) shows a first part of a table illustrating potentials of each part, logics of the sense amplifiers and a part of control of the data transfer circuit 5 in the embodiment of FIG. 12.

FIG. 18 (B) shows the latter part of the table shown in FIG. 18 (A).

FIG. 19 (A) shows a table illustrating relations among logics of the sense amplifiers, sets of output data and parallel binary output data in the embodiment of FIG. 12.

FIG. 19 (B) shows a table illustrating relations among parallel binary input data, logics of the sense amplifiers, a part of control of the data transfer circuit 5 and potentials of each part in the embodiment of FIG. 12.

FIG. 20 (B) shows relation among initial values Vs, differential potentials Vx and reference potentials VR1, VR2 and VR3.

DETAILED DESCRIPTION OF THE PREFERRED EMBODIMENTS

Now, embodiments of the present invention are described in connection with the drawings.

Figure 1:
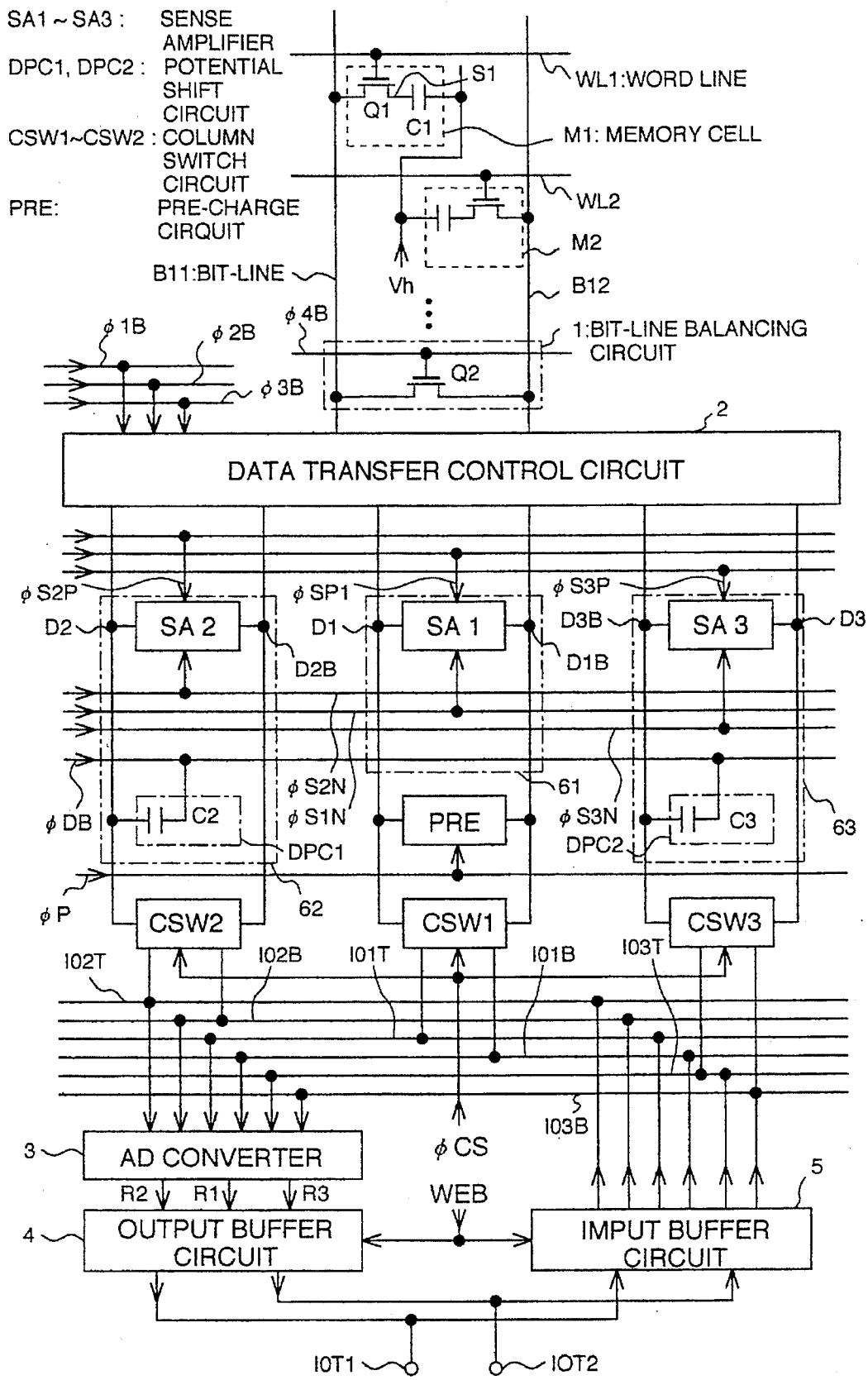
FIG. 1 is a block diagram of a first embodiment of the invention.
Figure 2:
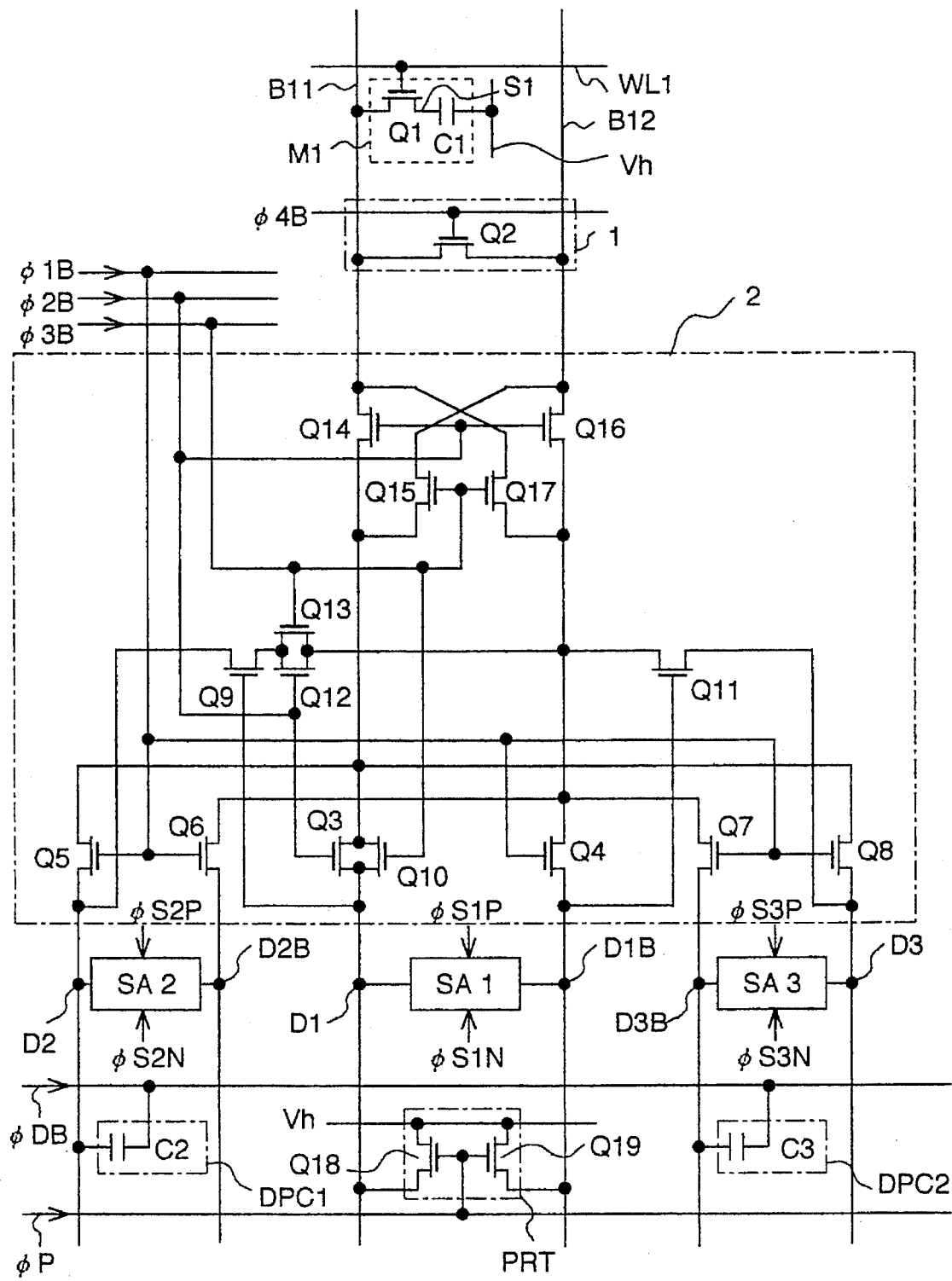
FIG. 2 is a circuit diagram of a principal part of the embodiment of FIG. 1

FIG. 1 is a block diagram of a first embodiment of the invention and FIG. 2 is a circuit diagram of a principal part of the embodiment.

A pair of bit-lines is composed of a first bit-line B11 and a second bit-line B12. To the bit-line B11, there are connected a plurality of memory cells MI. Each of the memory cells M1 comprises a transistor Q1 for switching and a memory capacitor C1 for storing a charge, the transistor Q1 being connected between the bit-line B11 and an electrode of the memory capacitor C1 with its source and drain and also connected to a word-line WL1 with its gate, the other electrode of the memory capacitor C1 being supplied with a middle reference voltage Vh which is a half of a source voltage Vcc. To the bit-line B12, there are also connected plurality of memory cells M2 having the same contrivance as the memory cells M1.

Write signals or read-out signals from/to selected one of the memory cells M1 or M2 are transferred by the two bit-lines B11 and B12. One of the memory cells M1 or M2 stores the signal delivered by the bit-lines B11 and B12 and sends out the stored signal to the bit-lines B11 and B12, when selected by stimulating a corresponding word-line of the word-lines WL1, WL2, . . . .

A pre-charge circuit PRE pre-charges the bit-lines B11 and B12 at an appointed timing by a pre-charge control signal φP.

A word-line selects a memory cell and a differential potential is generated between the bit-lines B11 and B12.

In the following paragraphs, composition of the embodiment is described for the first place, assuming that a memory cell connected to the bit-line B11 is selected and the potential of the bit-line B11 is changed.

As first means 61 for generating a read-out potential, a first sense amplifier SA1 amplifies and outputs the differential potential between the bit-lines B 11 and B12 according to first sense amplifier activating signals φS1P and φS1N. When the potential of the bit-line B11 is higher than the middle reference voltage Vh of the bit-line B12, that is when the read-out signal corresponds to one of the two higher levels of four levels storable in memory cells, the sense amplifier SA1 outputs a first read-out potential of the source voltage Vcc at its first in-out terminal D1 (and a fourth read-out potential 0 V at its second in-out terminal D1B), or outputs the fourth read-out potential at the in-out terminal D1 when the read-out signal corresponds to one of the two lower levels (and the first read-out potential at the second in-out terminal DIB).

Second means 62 for generating a read-out potential are composed of a second sense amplifier SA2 and a first potential shift circuit DPC1. To an electrode of a potential shift capacitor C2 of the potential shift circuit DPC1 is supplied with the potential of the bit-line B11, which is shifted to lower side by a fixed value with a potential shift control signal φDB supplied to the other electrode of the potential shift capacitor C2. The sense amplifier SA2 amplifies the differential potential between the shifted potential and the middle reference voltage Vh of the bit-line B12 according to second sense amplifier activating signals φS2P and φS2N.

Here, in the second means 62 for generating a read-out potential, the input potential at a first in-out terminal D2 is so shifted as to be higher than the middle reference voltage Vh only when the potential of the bit-line B 11 corresponds to the highest level of the four levels. And the sense amplifier SA2 outputs the first read-out potential of the source voltage Vcc at the in-out terminal D2 and a third read-out potential Vcc/3 at a second in-out terminal D2B of the sense amplifier SA2 only when the potential of the bit-line B11 corresponds the highest level of the four levels, otherwise outputting the third read-out potential at the in-out terminal D2 and the first read-out potential at the in-out terminal D2B.

Third means 63 for generating a read-out potential are composed of a third sense amplifier SA3 and a second potential shift circuit DPC2 with a potential shift capacitor C3 which shifts here the supplied potential from the bit-line B12 to lower side by a fixed value with the potential shift control signal φDB. The sense amplifier SA3 amplifies the differential potential between the potential supplied from the bit-line B11 and the shifted middle reference voltage according to third sense amplifier activating signals φS3P and φS3N, outputting the fourth read-out potential of 0 V at the in-out terminal D3 and a second read-out potential of 2 Vcc/3 at a second in-out terminal D3B only when the potential of the bit-line B 11 corresponds the lowest level of the four levels, and otherwise outputting 2 Vcc/3 at the in-out terminal D3 and the fourth read-out potential at the in-out terminal D3B of the sense amplifier SA3.

An AD converter receives the read-out potentials from the first and the second in-out terminals D1 and D1B, D2 and D2B and D3 and D3B of the sense amplifiers SA1, SA2 and SA3 through column switch circuits CSW1, CSW2 and CSW3, which selects a column (a pair of bit-lines) appointed by a column select signal φCS, and through I/O data busses IO1T, IO1B, IO2T, IO2B, IO3T and IO3B. The AD converter 3 outputs three data R1, R2 and R3, the data R1 being at logic '1' when the first in-out terminal D1 of the sense amplifier SA1 is at the first read-out potential and otherwise at logic '0', the data R2 being at logic '1' when the first in-out terminal D2 of the sense amplifier SA2 is at the first read-out potential and otherwise at logic '0', and the data R3 being at logic '0' when the first in-out terminal D3 of the sense amplifier SA3 is at the fourth read-out potential and otherwise at logic '1'.

An output buffer circuit 4 receives the data R1, R2 and R3 from the AD converter and outputs the data R1 to a first I/O terminal IOT1, and to a second I/O terminal IOT2, the data R2 when the logic of the data R1 is '1', or the data R3 when the logic of the data R1 is '0'.

Means for generating a refreshing potential are composed of a data transfer control circuit 2 and a bit-line balancing circuit 1. The date transfer circuit 2 has transistors Q3 to Q17.

The transistors Q3 to Q8 and transistors Q10 and Q14 to Q17 are for controlling signal transfer from the bit-lines B11 and B12 to the in-out terminals D1 and D1B, D2 and D2B and D3 and D3B of the sense amplifiers SA1, SA2 and SA3, or vice versa, according to transfer control signals φ1B, φ2B and φ3B. The transistors Q4 to Q8 are controlled by the transfer control signal φ1B, the transistors Q10, Q12, Q14 and Q16 are controlled by the transfer control signal φ2B, and is the transistors Q10, Q13, Q15 and Q17 are controlled by the transfer control signal φ3B. The transistors Q9 and Q11 are controlled by potentials of the in-out terminal D1 and D1B respectively of the sense amplifier SA1.

The data transfer circuit 2 transfers the signal potentials of the bit-lines B11 and B12 to the three sense amplifiers SA1, SA2 and SA3, and it transfers the amplified potentials from the sense amplifiers to the bit-lines B11 and B12 as follows.

The potential at the first in-out terminal D1 of the sense amplifier SA1 is transferred to the bit-line B11. And to the bit-line B12, the potential at the first in-out terminal D2 of the sense amplifier SA2 is transferred when the potential at the in-out terminal D1 is at the first read-out potential of Vcc, while the potential at the first in-out terminal D3 of the sense amplifier SA3 being transferred when the in-out terminal D1 is at the fourth read-out potential of 0 V.

The bit-lines B11 and B12 are connected for unifying the two read-out potentials to obtain a write potential to be stored at the node S1 of the selected memory cell at an appointed timing by the bit-line balancing circuit 1 having a transistor Q2 connected to the bit-lines B11 and B12 with its source and drain and controlled by a control signal φ4B supplied to its gate.

Means for buffering and DA converting input data are composed of an input buffer 5 and the sense amplifiers SA1, SA2 and SA3. The input buffer 5 transfers parallel binary input data from the first I/O terminal IOT1 to the sense amplifier SA1 through the I/O data busses IO1T and IO1B and the column switch circuit CSW1, and data input from the second I/O terminal IOT2 to the sense amplifiers SA2 and SA3 through the I/O data busses IO2T, IO2B, IO3T and IO3B and the column switch circuit CSW2 and CSW3. According to the binary input data, the sense amplifiers SA1, SA2 and SA3 generate a first, a second, a third or a fourth write potentials, which correspond to the first, the second, the third and the fourth read-out potentials respectively and two of them unified are supplied to the selected memory cell.

Figure 3:
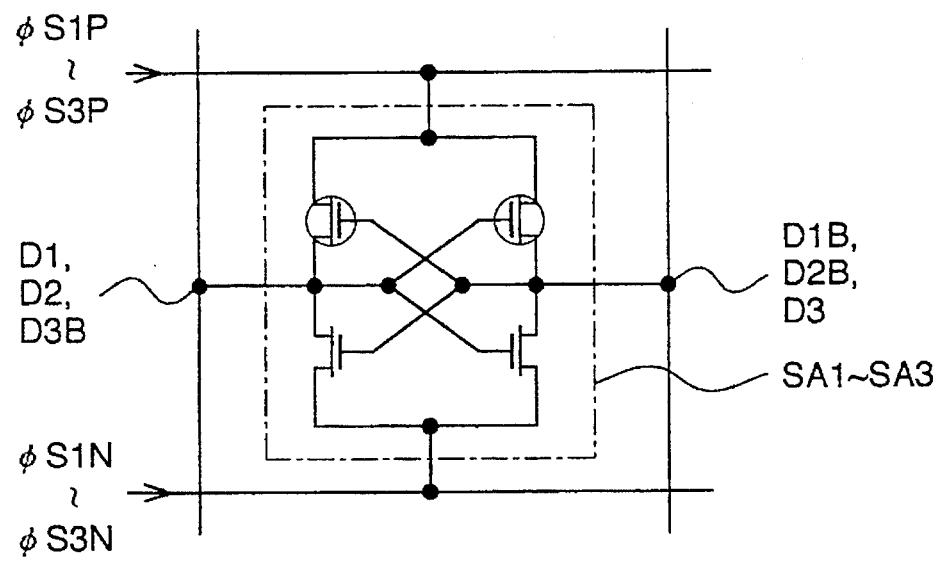
FIG. 3 (A) is a circuit diagram of a sense amplifier in FIG. 1.
Figure 3:
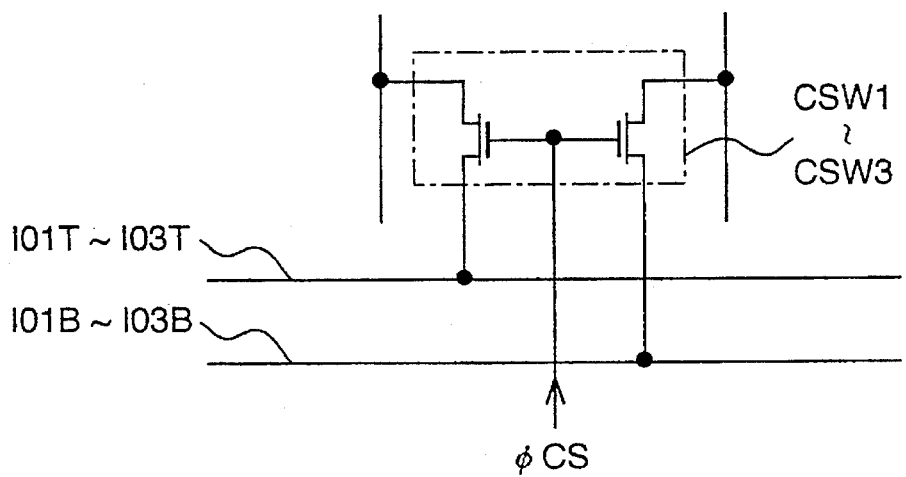
Figure 4:
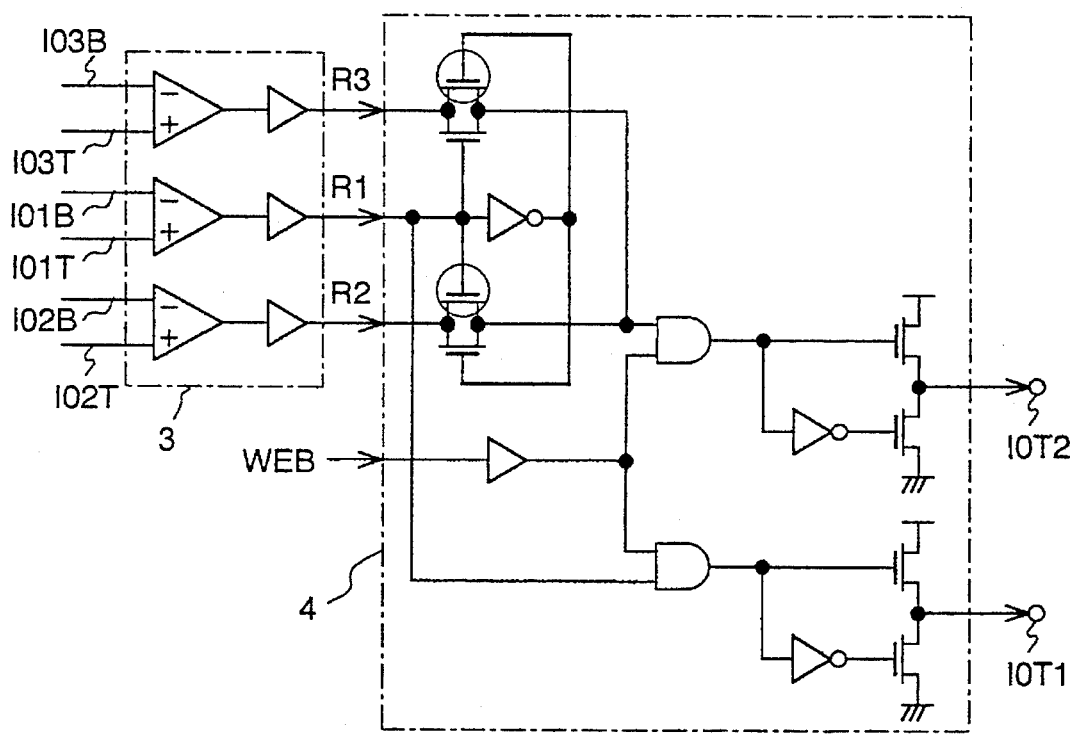
FIG. 4 (A) is a circuit diagram of the AD converter 3 and the output buffer 4 of FIG. 1.
Figure 4:
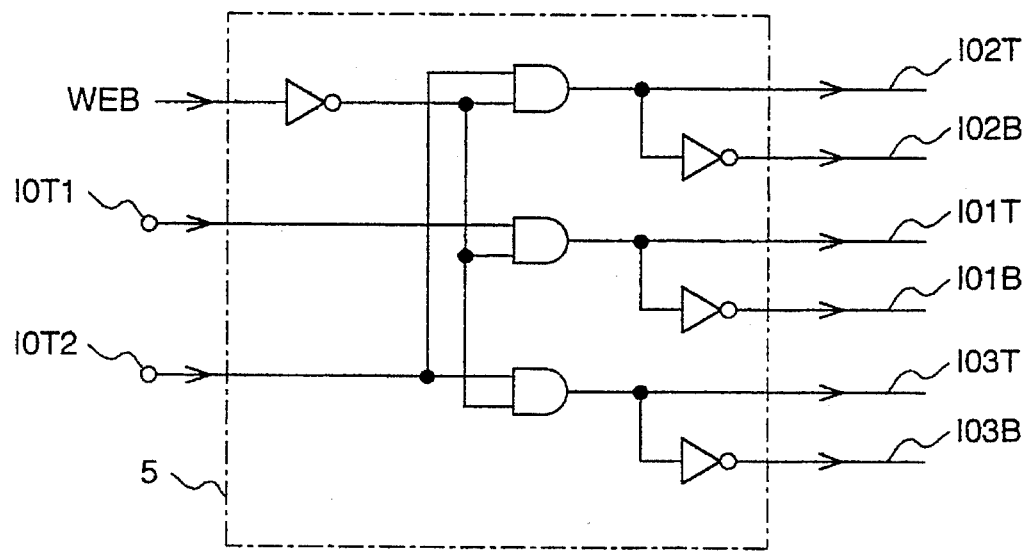

Here, each of the sense amplifiers SA1, SA2 and SA3 has a CMOS flip-flop type circuit as shown in FIG. 3 (A) for example, and each of the column switch circuits CSW1, CSW2 and CSW3 has a simple circuitry as shown in FIG. 3 (B). A circuitry of the AD converter circuit 3 and the output buffer 4 are shown in FIG. 4 (A) and a circuitry of the input buffer 5 is shown in FIG. 4 (B).

Figure 5:
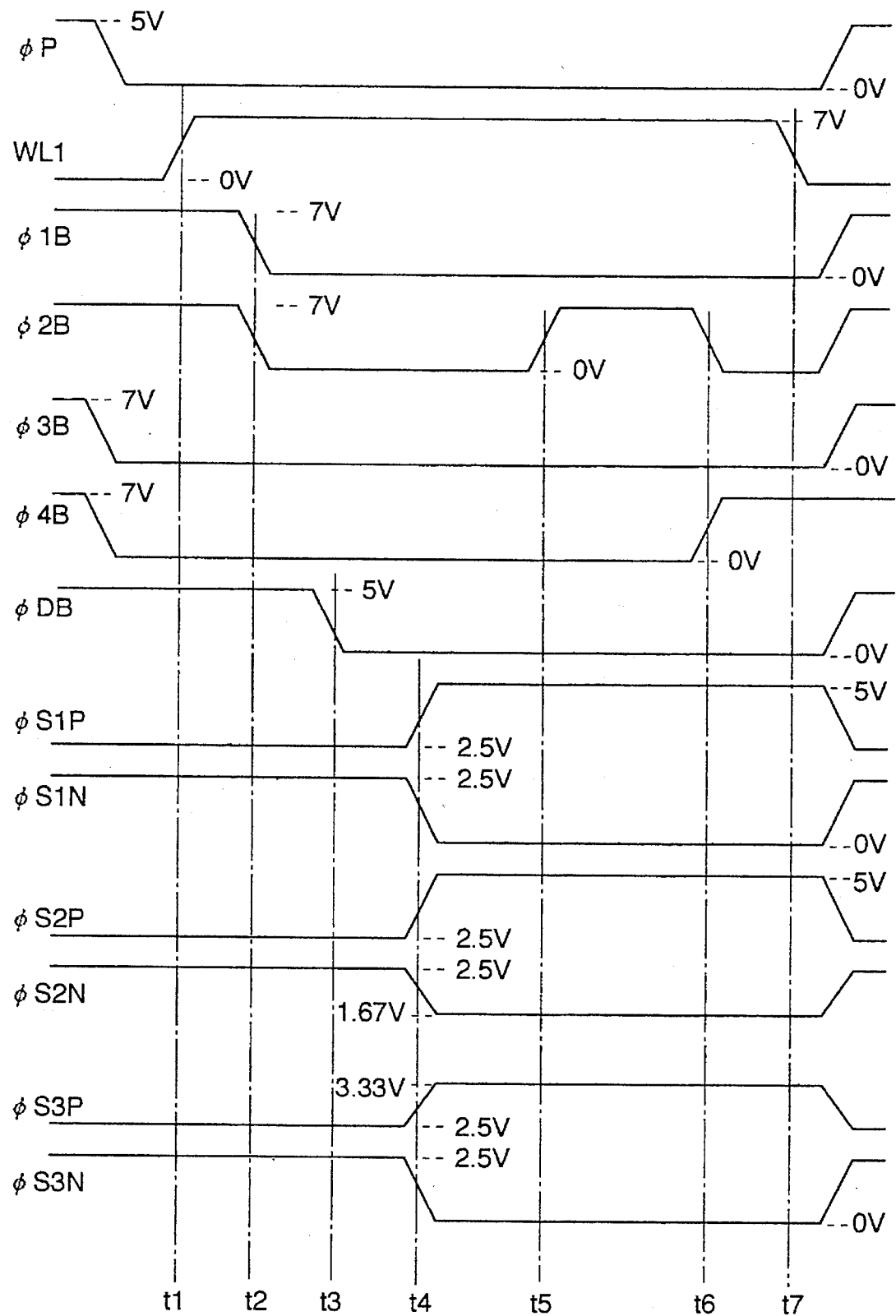
FIG. 5 illustrates wave forms and control timings of the control signals in the embodiment of FIG. 1.
Figure 6:
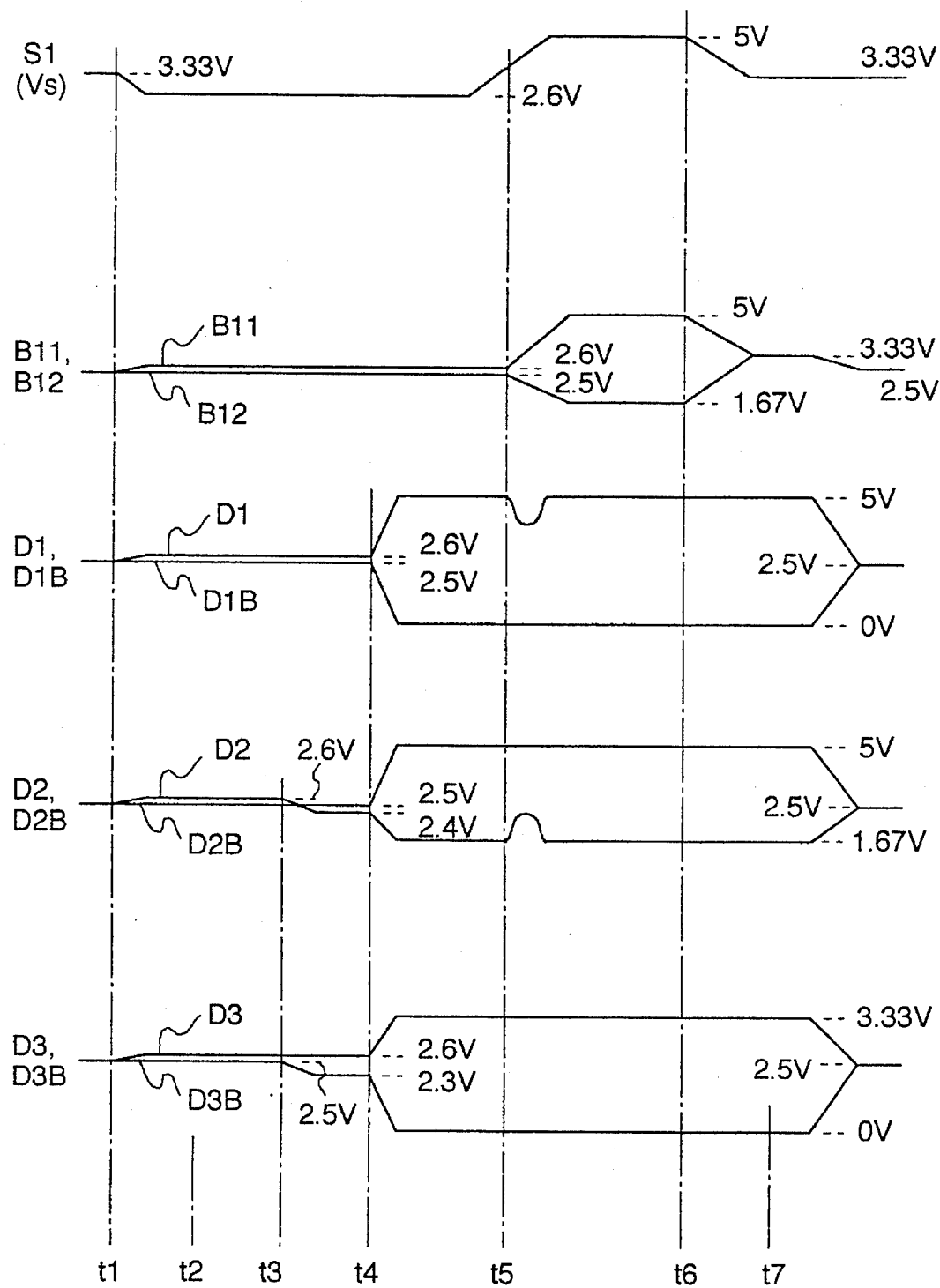
FIG. 6 illustrates an example of the wave form transitions of generated signals in the embodiment of FIG. 1.

Now, operations of the embodiment are described referring to FIG. 5 and FIG. 6. FIG. 5 illustrates control timings of the control signals, FIG. 6 illustrating the wave form transitions of the generated signals.

In a pre-charge period, that is, on a standby status, the transfer control signals φ1B to φ3B, the control signal φ4B and the potential shift signal φDB remains at high levels. The potentials of the sense amplifier activating signals φS1P, φS1N, . . . , φS3P and φS3N being a half (2.5 V) of the source voltage Vcc (5 V), the bit-lines B11 and B12 and the first and the second in-out terminals of the sense amplifiers SA1, SA2 and SA3 are all maintained at the middle reference voltage Vh. It is assumed here that an initial value Vs is stored at a node S1 of a memory cell connected to the bit-line B 11.

Capacitances of the bit-lines and the memory cells and so, differential potentials generated by stimulating a word-line will be described as having same values as described in connection with the third prior example and FIG. 20 (A) and FIG. 20 (B), FIG. 6 showing wave form transitions in case when the initial value Vs at the node S1 is 3.33 V which corresponds to (b) in FIG. 20 (B).

First, the pre-charge control signal φP, the transfer control signal φ3B and the control signal φ4B changes their status from the high levels (called H-levels) to a low level (called a L-level) of 0 V, for preparing for a selection by a word-line.

Figure 20:
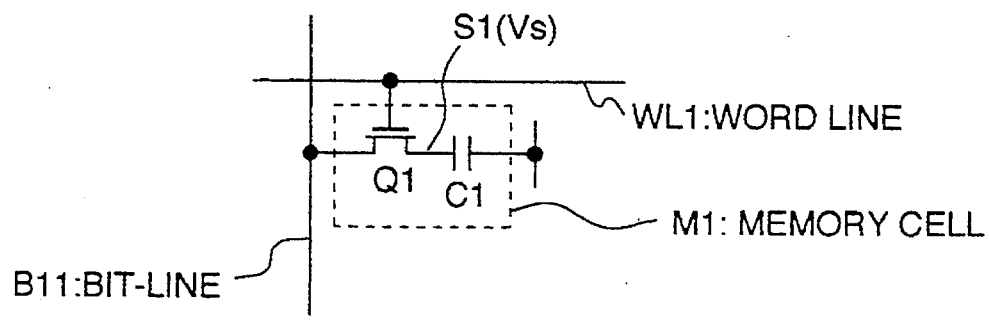
FIG. 20 (A) shows a memory cell with a capacitor and a transistor.
Figure 20:
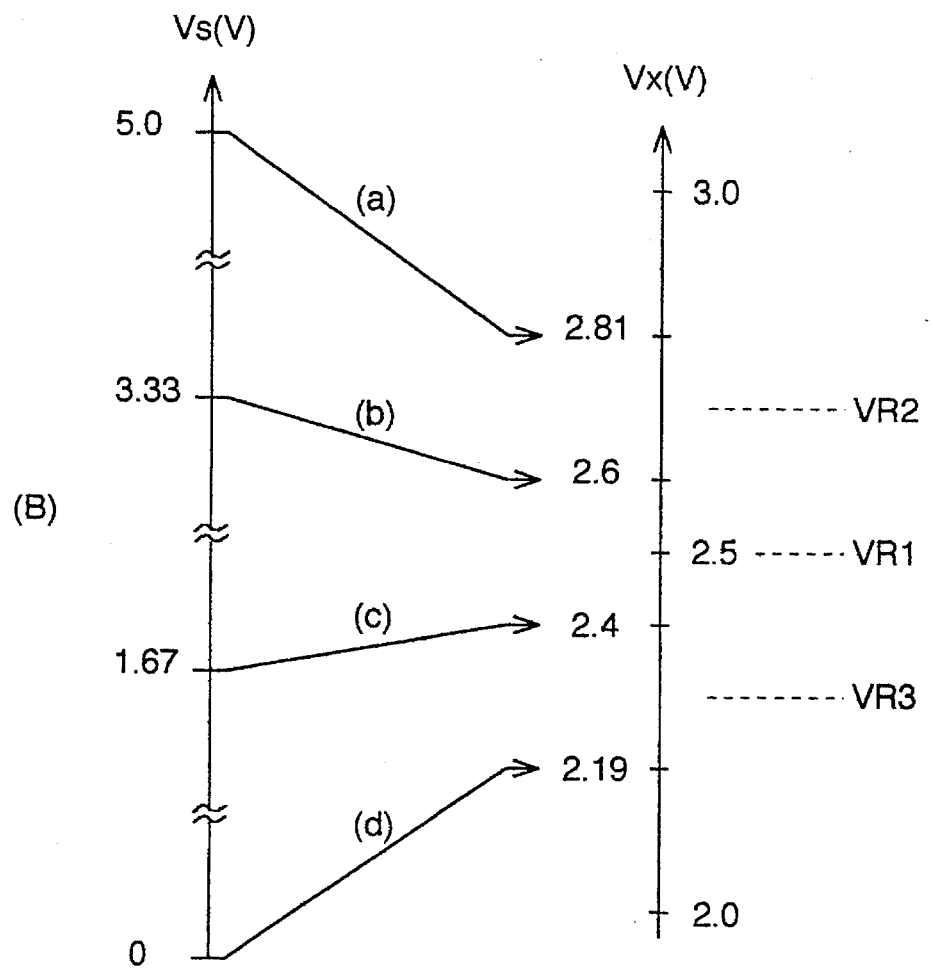

When a word-line WL1 becomes at H-level at a timing t1 of FIG. 5 and FIG. 6, the potentials of the bit-line B11 and the first in-out terminals D1, D2 and D3 of the sense amplifiers SA1, SA2 and SA3 become 2.6 V, which corresponds to Vx of (b) in FIG. 20 (B), while the potentials of the bit-line B12 and the second in-out terminals D1B, D2B and D3B remaining 2.5 V.

At a timing t2 after the differential potentials are delivered to in-out terminals of the sense amplifiers through the bit-lines B11 and B12, the transfer control signals φ1B and φ2B are shifted from H-level to L-level for cutting the bit-lines B11 and B12 from the sense amplifiers SA1, SA2 and SA3 electrically.

Then, at a timing t3, the potential shift control signal φDB is changed from 5 V to 0 V for shifting the differential potentials at the in-out terminals D2 and D3B of the second and the third sense amplifiers SA2, SA3. For purpose, the capacitance Cr of the capacitor C2 and C3 is prepared is prepared as follows.

The potential (2.6 V) at the first in-out terminal D2 of the sense amplifier SA2 should be shifted to a lower voltage (2.4 V, corresponding Vx of (c) in FIG. 20) by one level of the four levels to be discriminated by the sense amplifier SA2 comparing with the middle reference voltage Vh at the second in-out terminal D2B. For shifting by one level, the value of the capacitance Cr is to give an equation;

$$Cd \cdot Vj + Cr(Vj-5) = Cd \cdot Vy + Cr \cdot Vy, \quad (2)$$

where, Cd, Vj and Vy are the floating capacitance, the potential when φDB is at 5 V and the potential when φDB is at 0 V respectively, of the in-out terminal D2.

From the equation, Cr is obtained as follows.

$$Cr = Cd/\{5/(Vj-Vy)-1\}$$

When Vj=2.6 V, Vy=2.4 V and Cd=30 fF, the capacitance Cr becomes about 1.25 fF.

By thus preparing, the sense amplifier 2 is able to decide only the highest level (a) (in FIG. 20 (B)) as logic '1', and others as logic '0'.

As for the potential at the second in-out terminal D3B of the sense amplifier SA3, by preparing the values of Cd and Cr in the second potential shift circuit DCP2 as same as the values above obtained, it can be shifted by 0.2 V to lower side similarly as the potential at the first in-out terminal D2 of the second sense amplifier SA2. Thus the sense amplifier SA3 can decide the levels (a), (b) and (c) as logic '1' and only the level (d) as logic '0'.

Thus prepared, just before a timing t4 when the sense amplifiers are activated, the potentials at each in-out terminal are 2.6 V at D1, 2.5 V at D1B, 2.4 V at D2, 2.5 V at D2B, 2.6 V at D3 or 2.3 V at D3B. Therefore, when the sense amplifiers SA1, SA2 and SA3 are activated at the timing t4, the in-out terminals D1, D2B and D3 become at H-levels, the in-out terminals D1B, D2 and D3B at L-levels. Here, the sense amplifier activating signals all having initial values 2.5 V, φS1P changes to 5 V, φS1N changes to 0 V, φS2P changes to 5 V, φS2N changes to 1.67 V, φS3P changes to 3.33 V and φS3N changes to 0 V. Therefore, the amplified potential of the in-out terminal D1 becomes 5 V a time after the timing t4, while D φ1B 0 V, D2 1.67 V, D2B 5 V, D3 3.33 V and D3B 0 V.

Then, only the transfer control signal φ2B returns at H-level at a timing t5 to transfer re-write signals to the bit-lines B11 and B12. The other transfer control signals Sφ1B and φ3B remaining at L-level, the NMOS type transistors Q3 to Q8 of the data transfer circuit remain OFF except the transistor Q3. So, only the in-out terminal D1 is connected to the bit-line B11.

The bit-line B12 is connected to either of the in-out terminal D2 or D3 through the NMOS type transistors Q9 to Q17. In this case, the in-out terminal D2 is connected to the bit-line B12 through the transistor Q9 and Q12, since the transistor Q11 controlled by the potential of the in-out terminal D1B remains OFF because of the L-level of the in-out terminal D1B and the transistor Q15 and Q17 remain OFF among the transistors Q14, Q15, Q16 and Q17 controlled by the transfer control signals φ2B and φ3B because of the L-level of the transfer control signal φ3B.

Therefore, although the potentials of the bit-lines B11 and B12 remaining unstable because of the selection of the word-line just after the timing t5 when the transfer control signal φ2B is turned to H-level, the potential of the bit-line B11 finally becomes 5 V, which is the potential of the sense amplifier activating signal φS1P, and the potential of the bit-line B12 finally becomes 1.67 V, which is the potential of the sense amplifier activating signal φS3N.

Then, at a timing t6, the transfer control signal φ2B is returned to L-level and the control signal φ4B is returned to H-level, for separating the bit-lines B11 and B12 from the sense amplifiers SA1, SA2 and SA3 and connecting them to each other. Since the bit-line B11 and B12 have same capacitances and are charged with 5 V and 1.67 V respectively, the potential of the bit-lines B11 and B12 and consequently the potential of the node S1 of the selected memory cell becomes 3.33 V.

At a next timing t7, the word-line WL1 returning to L-level, a refresh cycle is accomplished and the node S1 maintains as same potential as before selected by the word-line WL1.

After that, the potentials of the bit-lines B11 and B12, the in-out terminals D1, D1B, D2, D2B, D3 and D3B are returned to the standby status of 2.5 V by returning the transfer control signals φ1B, φ2B and φ3B and the pre-charge control signal φP to H-levels and returning the sense amplifier activating signals to 2.5 V.

Figure 7:
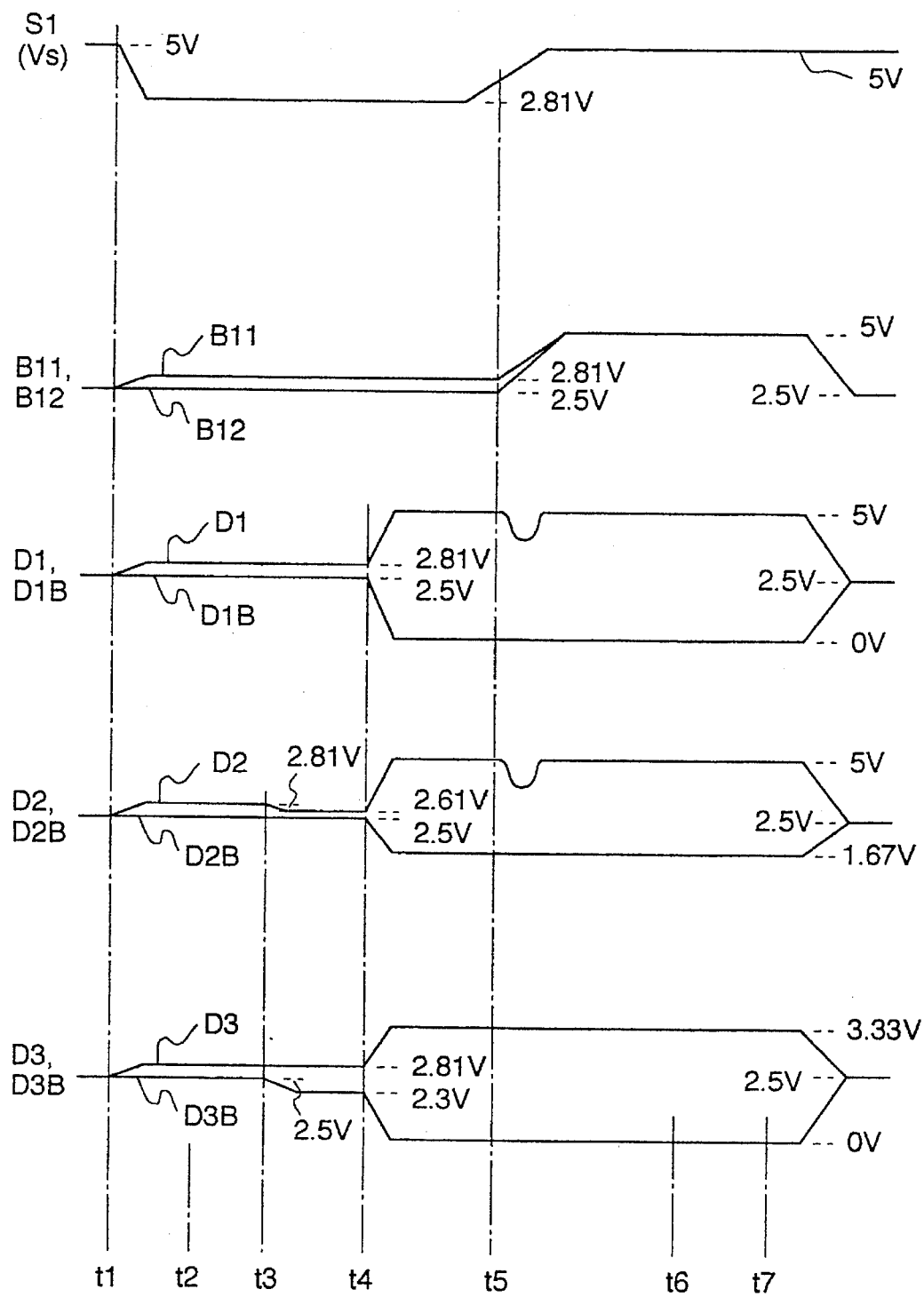
FIG. 7 illustrates another example of the wave form transitions of generated signals in the embodiment of FIG. 1.
Figure 8:
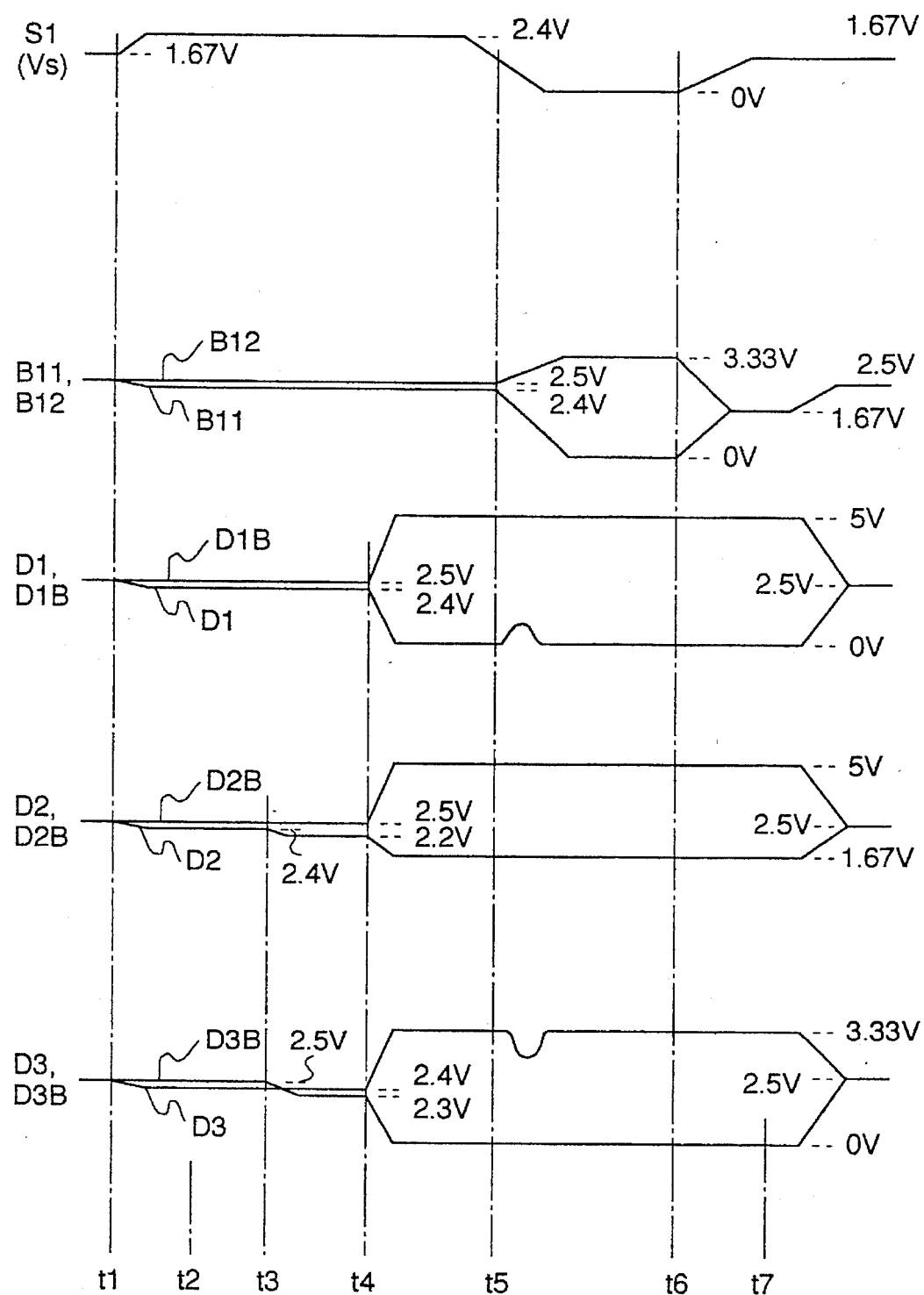
FIG. 8 illustrates second another example of the wave form transitions of generated signals in the embodiment of FIG. 1.
Figure 9:
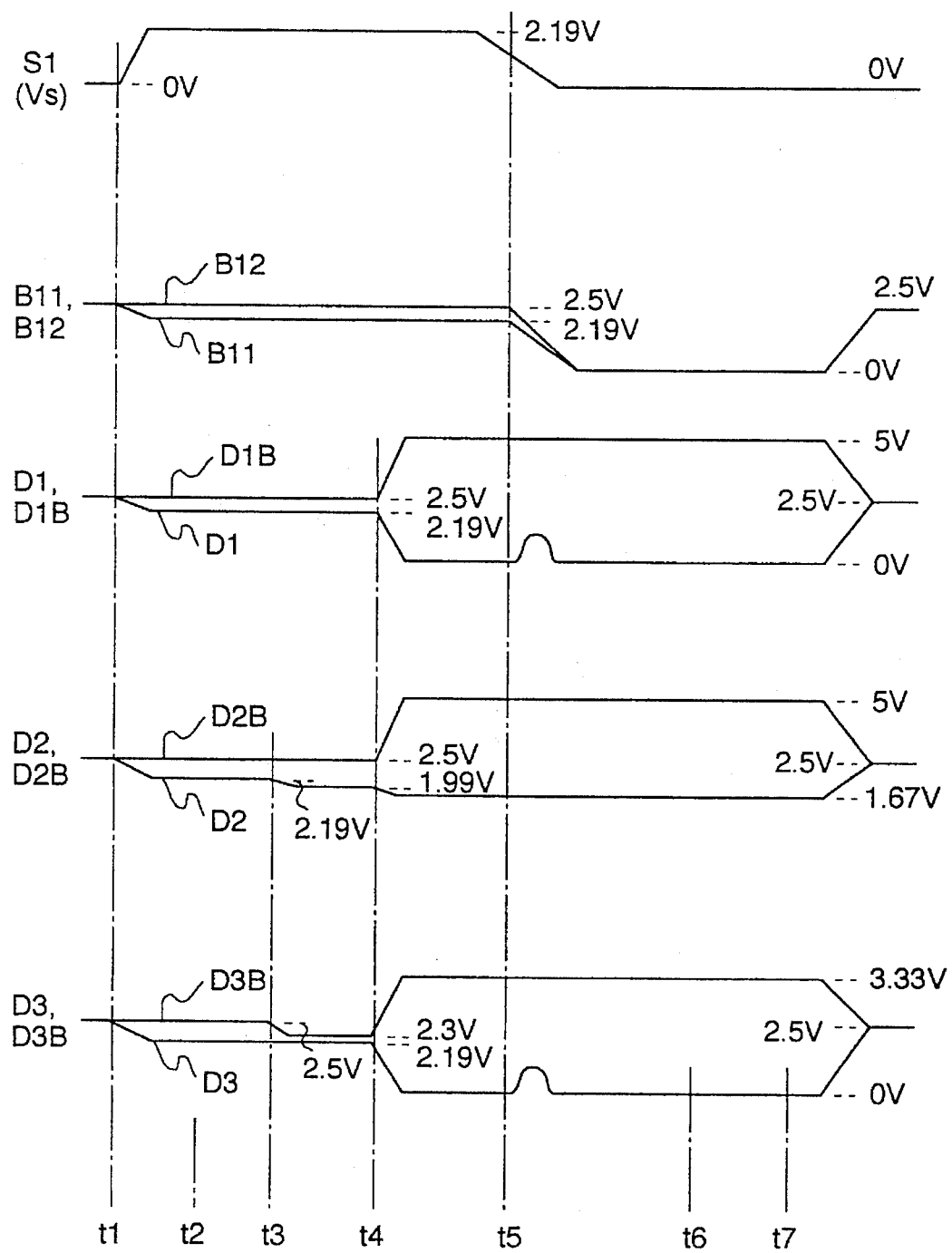
FIG. 9 illustrates still another example of the valve form transitions of generated signals in the embodiment of FIG. 1.

The wave form transitions of generated signals in cases when the initial value Vs is at level (a), (c) or (d) of FIG. 20 (B) are shown in FIG. 7, FIG. 8 or FIG. 9. As the operations are similar to the case described when the initial value Vs is at level (b), detailed descriptions are omitted and comparisons among the four levels (a) to (d) are summarized in FIG. 10 (A) and FIG. 10 (B).

In the following paragraphs, an output operation is described in connection with FIG. 11 (A) when data read-out from the memory cell are output through the I/O terminals IOT1 and IOT2.

At a timing in the interval from the timing t4 to the timing t7, where the read-out potentials at the in-out terminals of the sense amplifiers SA1, SA2 and SA3 are stable, the column select signal φCS becomes at H-level, and the first, the second, the third and the fourth read-out potentials generated by the sense amplifiers SA1, SA2 and SA3 are transferred for AD converting to the AD converter 3 through the column switch circuits CSW1, CSW2 and CSW3 and through the data I/O busses IO1T, IO1B, . . . , IO3T and IO3B. The AD converter outputs a set of three out-put data R1, R2 and R3, the data R1 being at logic '1' when the logic of the sense amplifier SA1 is '1' and otherwise at logic '0', the data R2 being at logic '1' when the logic of the sense amplifier SA2 is '1' and otherwise at logic '0', and the data R3 being at logic '0' when the logic of the sense amplifier is '0' and otherwise at logic '1'.

From the first I/O terminal IOT1, the data R1 is output. From the second I/O terminal IOT2 the data R2 is output when the logic of the data R1 is '1', or the data R3 when the logic of the data R1 is '0'. Thus a pair of parallel binary output data corresponding to a level of the four levels storable in a memory cell is obtained as shown in FIG. 11 (A).

In FIG. 11 (B), the relation among data logics and potentials at each part of the embodiment is tabled when a pair of parallel binary input data is written and stored as one of the four levels in one of the memory cells M1 and M2. The operations being apparent from the descriptions concerning to the means for buffering and DA converting and to the means for generating a refreshing potential, the detailed descriptions thereof are omitted.

In the embodiment, a read-out time equivalent to that of ordinary binary DRAMs is obtained, as signal potentials of the bit-lines B11 and B12 read-out from a memory cell are transferred to the three sense amplifiers SA1, SA2 and SA3 at once and sensed at which level of the four levels by a cooperation of the three sense amplifiers for outputting as a pair of parallel binary output data. And a memory cell refreshment is performed with a refreshing potential obtained simply by transferring the read-out potentials to the bit-lines B11 and B12 and unifying them.

Figure 12:
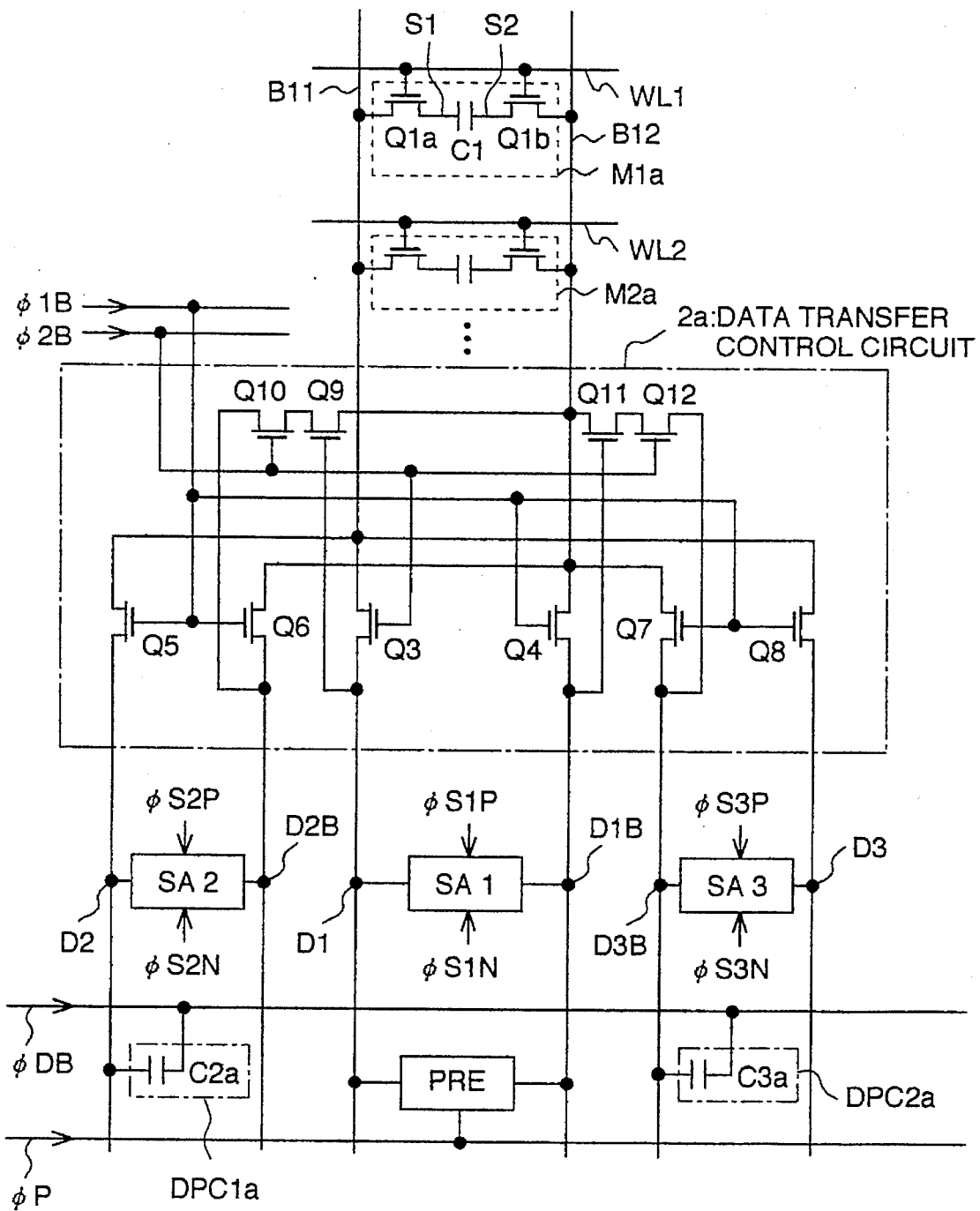
FIG. 12 is a circuit diagram of a principal part of a second embodiment.

FIG. 12 is a circuit diagram illustrating a principal part of a second embodiment of the present invention.

In the embodiment, each of memory cells M1a, M2a, . . . is a 2-transistor-1-capacitor type memory cell comprising a first transistor Q1a connected between a first bit-line B11 and an electrode of a memory capacitor C1 with its source and drain and connected to a word-line WL1 with its gate, and a second transistor Q1b connected between a second bit-line B12 and another electrode of the memory capacitor C1 with its source and drain and connected to the word-line WL1 with its gate.

First means 61 for generating a read-out potential comprises a first sense amplifier SA1.

Dividing a range of differential potentials read-out between the bit lines B11 and B12 beforehand pre-charged by a pre-charge circuit PRE into four levels, the sense amplifier SA1 compares signal potentials read-out and transferred to the bit-lines B11 and B12 with the four levels for generating a first read-out potential of 5 V at its first in-out terminal D1 connected to the bit-line B11 and a fourth read-out potential 0 V at its second in-out terminal D1B connected to the bit-line B12 when the potential of the bit-line B11 is higher than the potential of the bit-line B12, that means the read-out differential potential corresponds to one of higher two levels of the four levels, or generating the fourth read-out potential at its first in-out terminal D1 and the first read-out potential at the in-out terminal D1B when the potential of the bit-line B11 is lower than the potential of the bit-line B12.

Second an third means 62 and 63 for generating a read-out potential comprise a first potential shift circuit DPC1a, a second sense amplifier SA2, a second potential shift circuit DPC2a and a third sense amplifier SA3 respectively.

The first potential shift circuit DPC1a receives and shifts the signal potential read-out and generated at the bit-line B11 beforehand pre-charge by the pre-charge circuit PRE to lower side by a fixed value. The second sense amplifier SA2 compares the shifted potential by the potential shift circuit DPC1a with the potential of the bit-line B12 for generating a fourth read-out potential of 0 V at its second in-out out terminal D2B connected to the bit-line B12 when the potential of the bit-line B12 is lower than the shifted potential, that means the read-out differential potential corresponds to the highest level of the four levels, or generating the second read-out potential of 3.333 V at the in-out terminal D2B when the potential of the bit-line B12 is higher, that means the read-out differential potential corresponds to one of the three levels other than the highest level.

The second potential shift circuit DPC2a receives and shifts the signal potential read-out generated at the bit-line B12 beforehand pre-charged by the pre-charge circuit PRE to lower side by a fixed value. The sense amplifier SA3 compares the shifted potential by the potential shift circuit DPC2a with the potential of the bit-line B11 for generating a first read-out potential of 5 V at its second in-out terminal D3B connected to the bit-line B12 when the potential of the bit-line B11 is lower than the shifted potential, that means the read-out differential potential corresponds to the lowest level of the four levels, or generating the third read-out potential of 1.67 V at the input terminal D3B when the potential of the bit-line B11 is higher, that means the read-out differential potential corresponds to one of the three levels other than the lowest level.

Means for generating a refreshing potential are a part of a data transfer control circuit 2a comprising transistors Q3 to Q12.

The transistor Q3 transfers the potential at the in-out terminal D1 of the sense amplifier SA1 as a first write potential to the bit-line B11. The transistors Q9, Q10, Q11 and Q12 transfer the potential at the in-out terminal D2B of the sense amplifier SA2 as a second write potential to the bit-line B12 when the potential at the first in-out terminal D1 of the sense amplifier SA1 is the first read-out potential of 5 V, or the potential at the second in-out terminal D3B of the sense amplifier SA3 as the second write potential to the bit-line B12 when the potential at the in-out terminal D1 is the fourth read-out potential of 0 V.

The transistors Q3 to Q8 are for controlling signal transfer from the bit-lines B11 and B12 to the in-out terminals D1 and D1B, D2 and D2B and D3 and D3B of the sense amplifiers SA1, SA2 and SA3, transistor Q3 being used also for transferring the first write potential as described.

Other parts have same contrivances as in the first embodiment.

Before operations of the second embodiment are described, the differential potentials obtained between the bit-lines B11 and B12 are calculated. Suppose the value of the floating capacitance of each bit-line is Cb and the capacitance of the memory capacitor C1 and Cs for a comparison with the third prior example, where Cb is a sum total of the gate capacitances of MOS transistors in the sense amplifiers, lead line capacitances to the in-out terminals of the sense amplifiers, diffusion capacitances of the transistor Q3 or Q4 and so on as same as other binary or multi-value DRAMs.

The potentials of the bit-line B11 and B12 being both Vh and the potentials of two nodes (two electrodes of the memory capacitor C1) S1 and S2 of a memory cell being Vs1 and Vs2 respectively, when the potentials of the bit-line B11 and B12 is changed to Vx1 and Vx2 by selecting the memory cell by a word-line, following two equations are obtained from total charges of both B11 side and B12 side before and after the selection.

$$Cb \cdot Vh + Cs(Vs1-Vs2) = Cb \cdot Vx1 + Cs(Vx1-Vx2)$$

$$Cb \cdot Vh + Cs(Vs2-Vs1) = Cb \cdot Vx2 + Cs(Vx2-Vx1)$$

From the two equation, Vx1 and Vx2 are represented by equations;

$$Vx1+Vx2=2Vh, \quad (3)$$

and $$Vx1-Vx2=2Cs(Vs1-Vs2)/(Cb+2Cs). \quad (4)$$

By substituting 350fF for Cb, 50fF for Cs, 2.5 V for Vh and the four values 0 V, 1.67 V, 3.33 V and 5 V of the two write potentials above described for Vs1 and Vs2 in the two equations (2) and (3) for obtaining concrete examples, the potentials of the bit-lines B11 and B12 or the potentials of the first in-out terminals and the second in-out terminals of the sense amplifiers after the selection by the word-line are calculated as shown in FIG. 18 (A), which is described afterwards.

Figure 13:
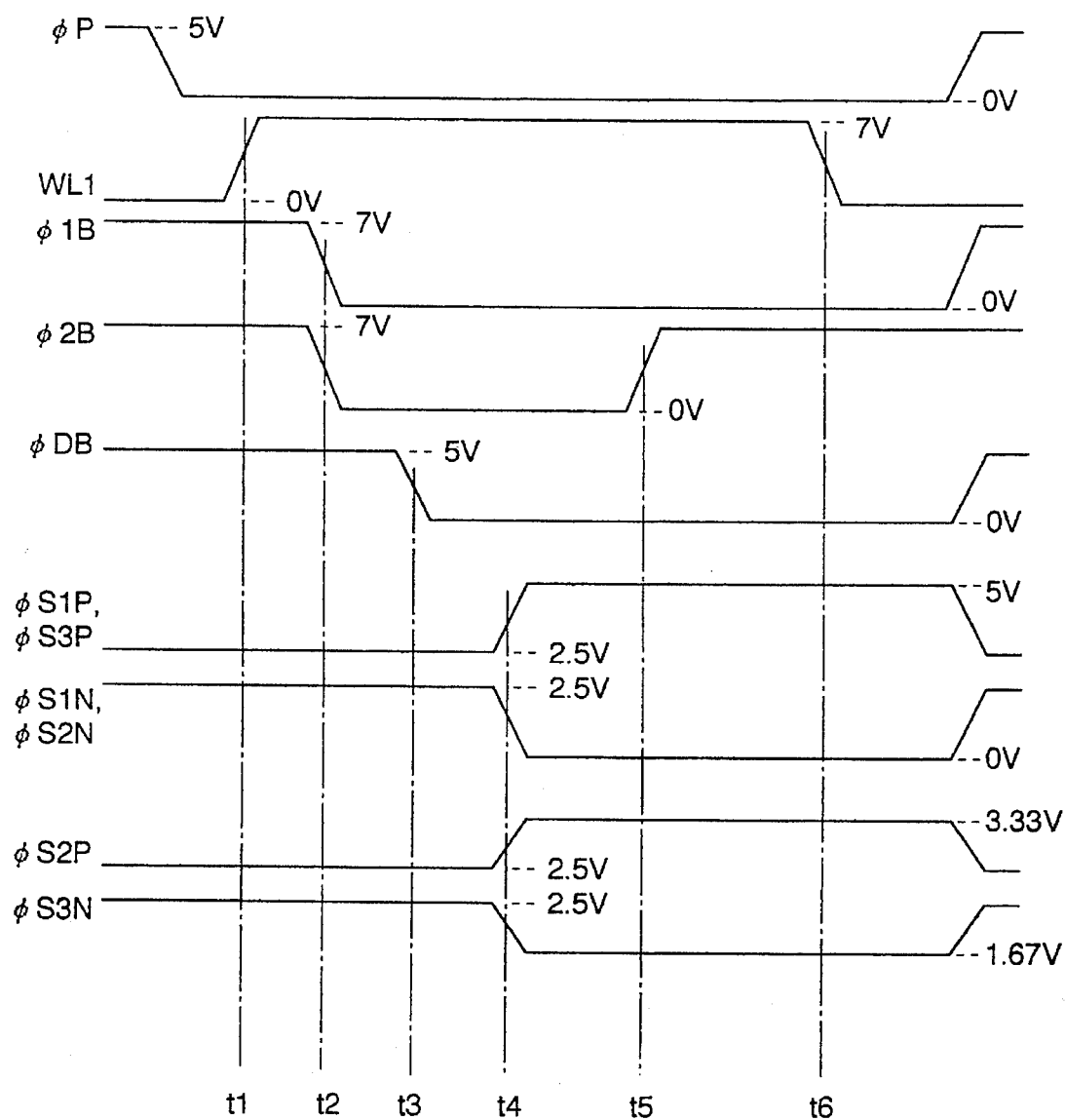
FIG. 13 illustrates wave forms and control timings of the control signals in the embodiment of FIG. 12.
Figure 14:
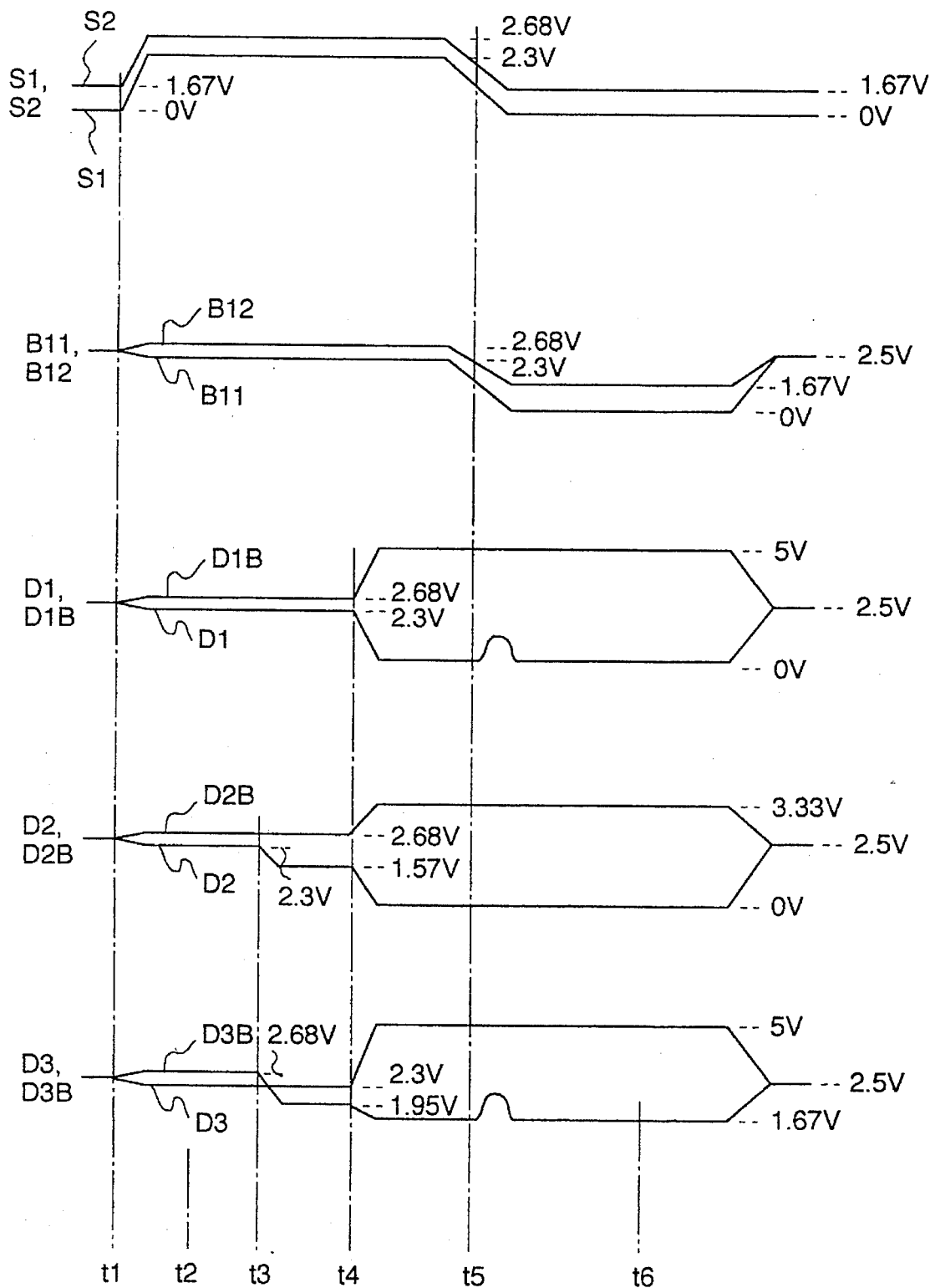
FIG. 14 illustrates an example of the wave form transitions of generated signals in the embodiment of FIG. 12.

Now, operations of the embodiment are described referring to FIG. 13 and FIG. 14 illustrating control timings of the transfer control signals and the wave form transitions in case when the differential potential corresponds to the second lowest level of the four levels (the case in FIG. 18 (A)) of the generated signals respectively.

At a timing, the bit-lines B11 and B12 and the first and second in-out terminals D1, D1B, . . . , D3 and D3B of the sense amplifiers SA1, SA2 and SA3 are all maintained at the middle reference voltage Vh (2.5 V) by the pre-charge circuit PRE, the potentials Vs1 and Vs2 (initial values) at the nodes S1 and S2 of a memory cell being 0 V and 1.67 V.

Then, the pre-charge control signal φP is changed from H-level to L-level for preparing for a selection by a word-line.

When a word-line WL1 becomes at H-level at a timing t1, the potentials of the bit-line B11 and the first in-out terminals D1, D2 and D3 of the sense amplifiers SA1, SA2 and SA3 become 2.31 V, and the potentials of the bit-line B12 and the second in-out terminals D1B, D2B and D3B become 2.68 V, as above calculated and shown in FIG. 18(A).

At a timing t2 after the differential potential is delivered to in-out terminals of the sense amplifiers through the bit-lines B11 and B12, the transfer control signals φ1B and φ2B are shifted from H-level to L-level for cutting the bit-lines B11 and B12 from the sense amplifiers SA1, SA2 and SA3 electrically.

Then, at a timing t3, the potential shift control signal φDB is changed from 5 V to 0 V for shifting the differential potentials at the first in-out terminal D2 and the second in-out terminal D3B of the second and the third sense amplifiers SA2 and SA3. For this purpose, the capacitance Cr of the potential shift capacitor C2 and C3 of the potential shift circuits DPC1a and DPC2a is prepared as follows.

In the embodiment, the potentials at the in-out terminal D2 is shifted so that the second highest value at the in-out terminal D2 (2.68 V, the value in case γ in FIG. 18 (A)) be shifted to the lowest value at the in-out terminal D2B (1.95 V, the value in case δ in FIG. 18 (A)), for the sense amplifier SA2 discriminating only the highest level of the differential potential (the case 5 in FIG. 18 (A)) as logic '1' and otherwise as logic '0'. For this purpose, the capacitance Cr is set to the value obtained as follows.

Similarly as described with the first embodiment, the equation (2) stands.

$$Cd \cdot Vj + Cr(Vj-5) = Cd \cdot Vy + Cr \cdot Vy \quad (2)$$

where, Cd, Vj and Vy are the floating capacitance, the potential when φDB is at 5 V and the potential when φDB is at 0 V respectively of the in-out terminal D2.

From the equation (2), Cr is obtained as follows.

$$Cr=Cd/\{5/(Vj-Vy)-1\}$$

When Vj=2.68 V, Vy=1.95 V and Cd=30 fF, the capacitance Cr becomes about 5.2 fF.

Thus preparing, all values of the potential at the in-out terminal D2 are shifted by 0.74 V=Vj−Vy to lower side.

As for the potential at the second in-out terminal D3B of the sense amplifier SA3, by preparing the values of Cd and Cr in the second potential shift circuit DCP2a as same as the values above obtained, it can be shifted by 0.74 V to lower side similarly as the potential at the first in-out terminal D2 of the second sense amplifier SA2. Thus the sense amplifier SA3 can decide only the lowest level (the case α in FIG. 18 (A)) of the four levels of the differential potential as logic '0', and other levels as logic '1'.

Thus prepared, just before a timing t4 when the sense amplifiers are activated, the potentials at each in-out terminal are 2.31 V at D1, 2.68 V at D1B, 1.57 V at D2, 2.68 V at D2B, 2.31 V at D3 or 1.95 V at D3B. Therefore, when the sense amplifiers SA1, SA2 and SA3 are activated, the in-out terminals D1, D2 and D3B become at L-levels, the in-out terminals D1B, D2B and D3 at H-levels. Here, the sense amplifier activating signals all having initial values 2.5 V, φS1P and φS3P change to 5 V, φS1N and φS2N change to 0 V, φS2P changes to 3.33 V, and φS3N changes to 1.67 V. Therefore, the amplified potential of the in-out terminal D1 becomes 0 V a time after the timing t4, while D1B and D3 5 V, D2 0 V, D2B 3.33 V and D3B 1.67 V.

Then, only the transfer control signal φ2B returns at H-level at a timing t5 for refreshing the selected memory cell. The other transfer control signals φ1B remaining at L-level, the NMOS type transistors Q3 to Q8 of the data transfer circuit remain OFF except the transistor Q3. So, only the in-out terminal D1 is connected to the bit-line B11.

The bit-line B12 is connected to either of the in-out terminal D2B or D3B through the transistors Q9 to Q12. In this case, the in-out terminal D3B is connected to the bit-line B12 through the transistor Q11 and Q12, since the transistor Q9 remains OFF.

Therefore, although the potentials of the bit-lines B11 and B12 remaining unstable because of the selection of the word-line WL1 just after the timing t5 when the transfer control signal φ2B is turned to H-level, the potential of the bit-line B11 finally becomes 0 V, which is the potential at the in-out terminal D1 of the sense amplifier SA1, and the potential of the bit-line B12 finally becomes 1.67 V, which is the potential at the in-out terminal D3B of the sense amplifier SA3.

At a timing t6, therefore, by returning the word-line WL1 to L-level, the nodes S1 and S2 are refreshed with the same potentials as the potentials before selected by the word-line WL1.

After that, the transfer control signals φ1B and the precharge control signal φP is returned to H-levels and the sense amplifier activating signals φS1P, φS1N, . . . , φS3P and φS3N are returned to 2.5 V, for returning the potentials of the bit-lines B11 and B12 and the in-out terminals of the sense amplifiers SA1, SA2 and SA3 to the middle referential voltage of 2.5 V.

Figure 15:
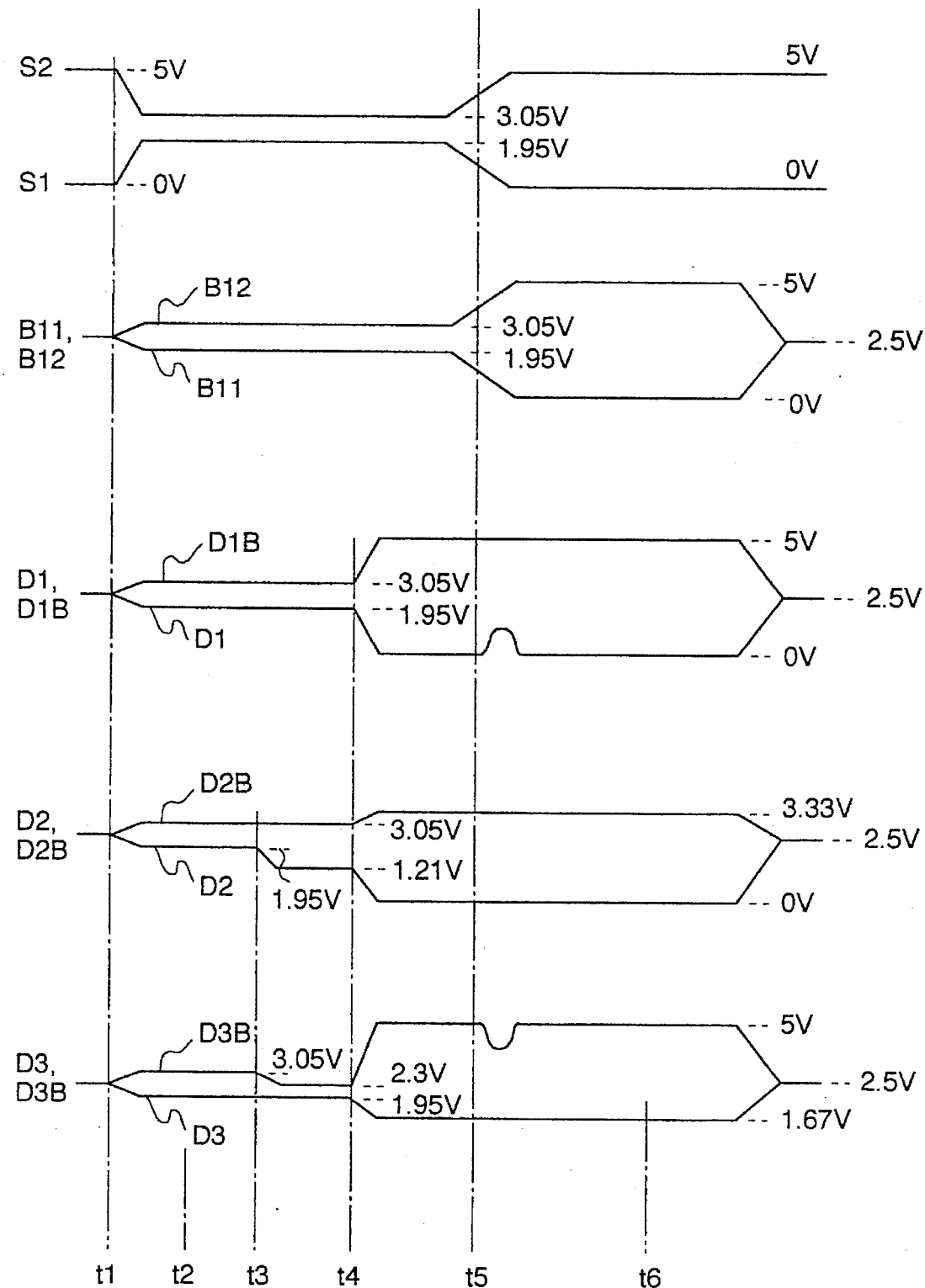
FIG. 15 illustrates another example of the wave form transitions of generated signals in the embodiment of FIG. 12.
Figure 16:
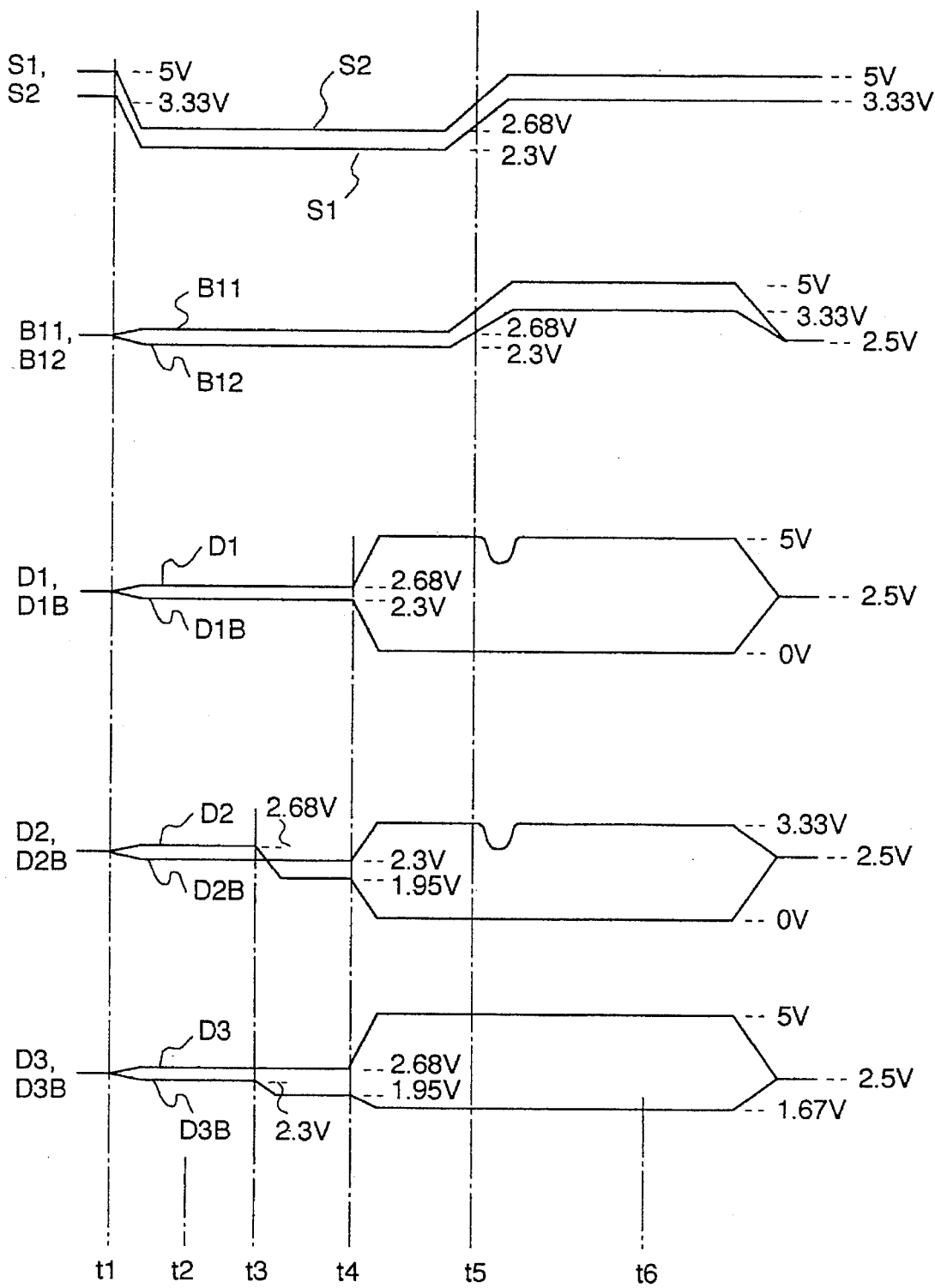
FIG. 16 illustrates second another example of the wave form transitions of generated signals in the embodiment of FIG. 12.
Figure 17:
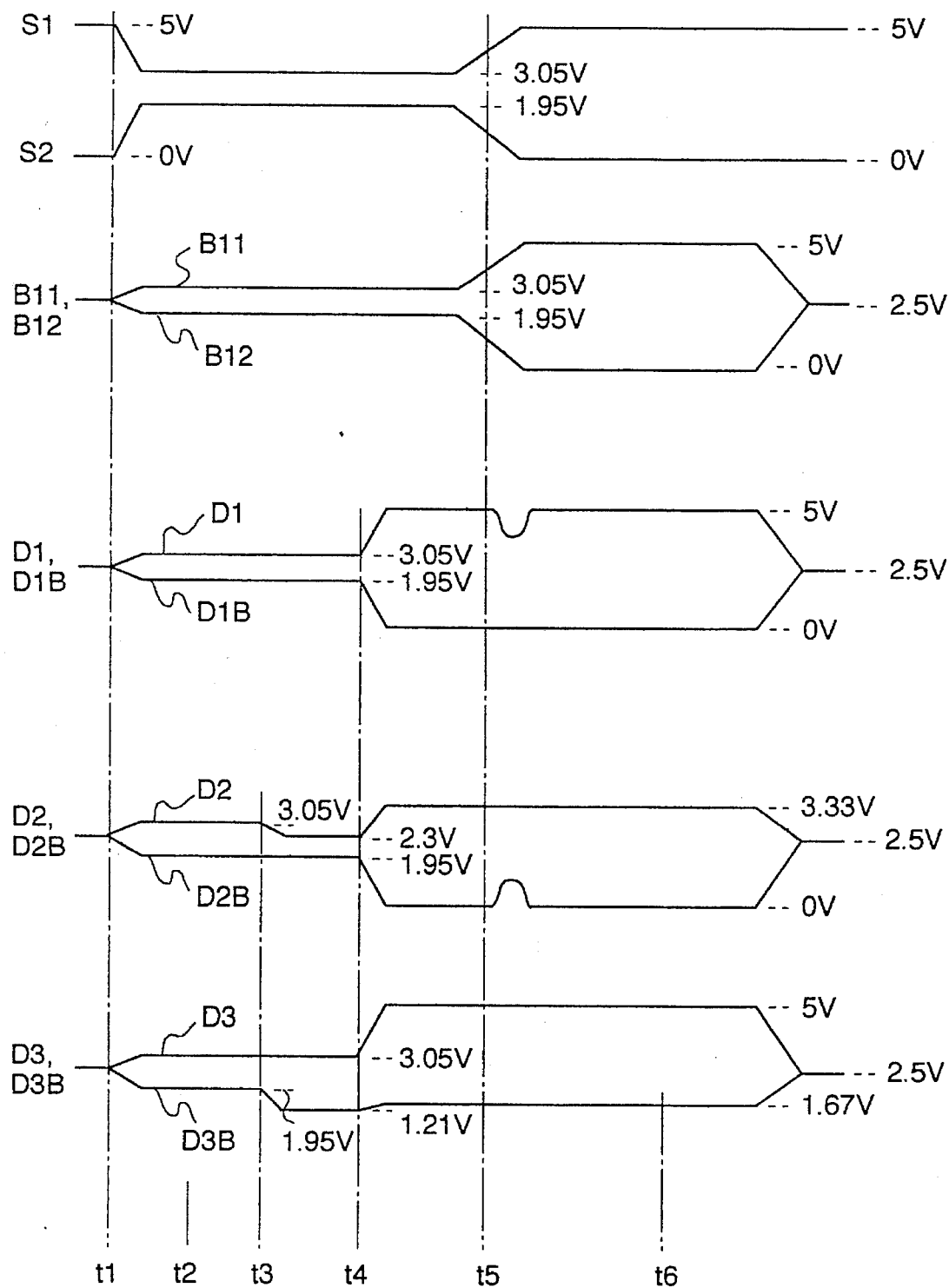
FIG. 17 illustrates still another example of the wave form transitions of generated signals in the embodiment of FIG. 12.

The wave form transitions of generated signals in other three cases α, γ and δ of the four cases corresponding to the four levels are shown in FIG. 15, FIG. 16 and FIG. 17. As the operations are similar to the case β above described, detailed descriptions are omitted and comparisons among the four cases α to δ are summarized in FIG. 18 (A) and FIG. (B). The data output or the data input of the embodiment is performed in the same way as the first embodiment, and detailed descriptions are also omitted. The relation among data logics and potentials at each part of the embodiment is tabled in FIG. 19 (A) and in FIG. 19 (B).

In the second embodiment, high speed operations being provided as same as in the first embodiment, there is another merit compared with the first embodiment that a larger operational margin is obtained.

A potential difference Def1 between the highest level and the lowest level of the differential potential in the first embodiment, or the third prior example is calculated as follows from the equation (1).

$$Def1 = \max(Vx) - \min(Vx) = Vcc \cdot Cs/(Cb+Cs)$$

In the second embodiment, a potential difference Def2 between the highest level and the lowest level is represented as follows from the equation (4).

$$\begin{aligned}Def2 &= \max(Vx1-Vx2) - \min(Vx1-Vx2)\\ &= 4Vcc \cdot Cs/(Cb+2Cs)\\ &= 4Def1(Cb+Cs)/(Cb+2Cs)\end{aligned}$$

Therefore, about 3.6 times of the discrimination margin for a sense amplifier is obtained compared with the first embodiment or the third prior example, when Cb=350 fF and Cs=50 fF. Still another merit is that the write times are still shortened as the bit-line balancing is not necessary in the second embodiment. In the first and the second embodiment, the invention has been described concerning a pair of bit-lines B11 and B12 and its peripherals, but it must be understood that there are many pairs of bit-lines and their peripherals in a DRAM and the invention can be applied to them.

Further, embodiments of the invention applied to memory cells storing four valued information are described heretofore, but the invention can be also applied to memory cells for storing more than four valued information without departing from the scope of the invention.

Figure 21:
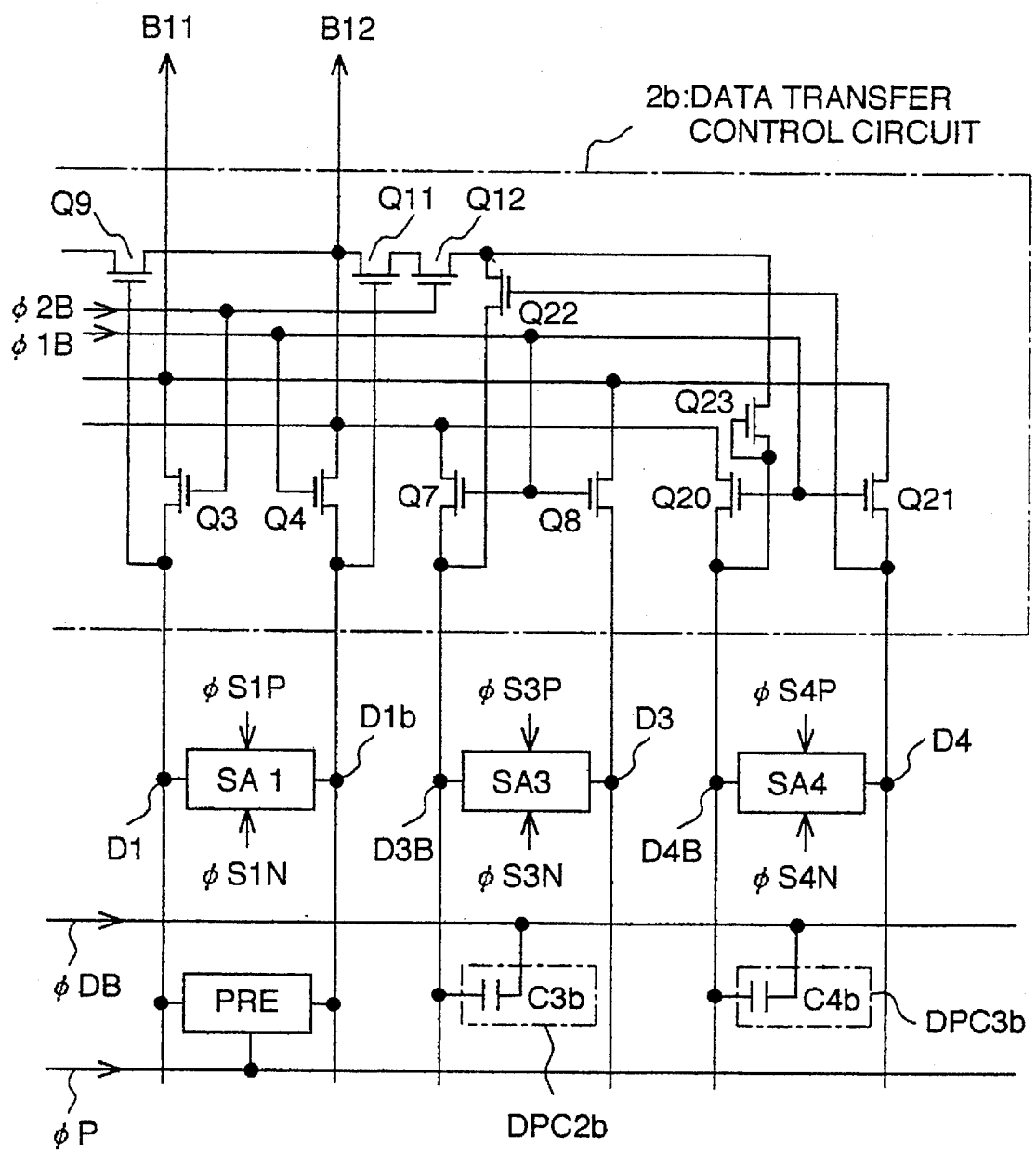
FIG. 21 is a circuit diagram of a modification of the circuit shown in FIG. 12.

FIG. 21 is a circuit diagram of a modification of the circuit shown in FIG. 12 for discriminating five valued information stored between the node S1 and the node S2. The modified circuit further comprises a fourth sense amplifier SA4 activated with sense amplifier signals (φS4P and φS4N, a third potential shift circuit DPC3b composed of a potential shift capacitor C4b, transistors Q20 and Q21 controlled with the transfer control signal φ1B for connecting in-out terminals D4 and D4B of the sense amplifier SA4 to the bit-lines B11 and B12, a transistor Q22 for connecting the in-out terminal D3B to the bit-line B12 when logic of the sense amplifier SA4 is '1', and a transistor Q23 diode connected for connecting the bit-line B12 to the in-out terminal D4B when the sense amplifier SA4 is at logic '0'.

Defining the fifth level of the initial value Vs1 and Vs2 as 0 V and 3.33 V respectively (other four levels being the same as the levels α to δ shown in FIG. 18 (A)), the potential of the bit-line B11 becomes 2.13 V and the potential of the bit-line B12 becomes 2.87 V when a memory cell at the fifth level is selected. For discriminating a differential potential of this level, the potential at the second in-out terminal D3B of the sense amplifier SA3 is shifted by 0.56 V to lower side and the potential at the second in-out terminal D4B of the sense amplifier SA4 is shifted by 0.92 V to lower side. For this purpose, the capacitances of the potential shift capacitors C3b and C4b are set to about 3.8 fF and 6.8 fF respectively.

Thus prepared, the sense amplifier SA3 becomes logic '0' when the differential potential is at the fifth level (−0.74 V) or the fourth level (−1.10 V, α in FIG. 18 (A)) and otherwise becomes logic '1', while the sense amplifier SA4 becomes logic '0' only when the differential potential is at the fourth level.

Therefore, when sense amplifier activating signals (φS3P, φS3N, φS4P and φS4N are shifted to 3.33 V (instead of 5 V), 1.67 V, 0 V and 5 V respectively for activating the sense amplifiers SA3 and SA4, the potential of the second in-out terminal D3B of the sense amplifier becomes 3.33 V, 3.33 V or 1.67 V in case the differential potential is at the fourth level, the fifth level or the third level, while the potential of the second in-out terminal D4B of the sense amplifier SA4 5 V, 0 V or 0 V and the first in-out terminal D4 of the sense amplifier SA4 0 V, 5 V or 5 V respectively generating the write potential of the fourth level (5 V) to be supplied to the bit-line B11 through the diode connected transistor Q23 from the in-out terminal D4, of the fifth level (3.33 V) or of the third level (1.67 V) from the in-out terminal D3B through a transistor Q22 controlled by the potential at the in-out terminal D4.

This modification is not but an example, but it can be understood that the first embodiment and the second embodiment of the invention are both applicable for DRAMs with memory cells storing any valued information by adding sense amplifiers, arranging the capacitances of the potential shift capacitors and preparing potentials of sense amplifier activating signals in a similar way, on condition that a sufficient differential potential is secured, although levels of differential potentials should be better divided equally into $2^n$ levels in consideration for an interface with binary data.

What is claimed is:

1. A multi-valued semiconductor memory device having a plurality of bit-memory units, each of said bit-memory units comprising:

a first and a second bit-lines;

a plurality of memory cells, each of said memory cells having a memory capacitor for storing a charge which generates a differential potential between said first and said second bit-lines and is recharged with potentials of said first and said second bit-lines when a word-line is charged;

at least two sets of means for generating a read-out potential, each of said at least two sets of means for generating a readout potential having a first and a second in-out terminal and a sense amplifier which discriminates a potential difference between said first and said second in-out terminals and turns to logic '1' by charging said first in-out terminal with a potential of a positive sense amplifier activating signal and said second in-out terminals with a potential of a negative sense amplifier activating signal in case said first in-out terminal is at a higher potential than said second in-out terminal, and to logic '0' by charging said first in-out terminal with the potential of said negative sense amplifier activating signal and said second in-out terminal with the potential of said positive sense amplifier activating signal in case said first in-out terminal is at a lower potential than said second in-out terminal when activated by said positive and said negative sense amplifier activating signals, and each except one of said at least two sets of means for generating a read-out potential having a potential shift capacitor for shifting one of potentials of the first and the second in-out terminals of said each except one by a fixed value to lower side when a potential shift control signal is turned to low level;

a data transfer control circuit for connecting each of said first and said second bit-lines to each of the first and the second in-out terminals of each of said at least two sets of means for generating a read-out potential for transferring said differential potential to said at least two sets of means for generating a read-out potential when controlled with transfer control signals, and connecting each of two in-out terminals of the first and the second in-out terminals of said at least two sets of means for generating a read-out potential to each of said first and said second bit-lines for recharging said memory capacitor in accordance with an ensemble of logic of the sense amplifier of each of said at least two sets of means for generating a read-out potential when controlled with said transfer control signals;

an AD converter for generating a set of output data, each of said set of output data corresponding to logic of the sense amplifier of each of said at least two sets of means for generating a readout potential;

an output buffer circuit for outputting parallel binary output data to I/O terminals by converting said set of output data; and means for buffering and DA converting parallel binary input data from the I/O terminals to a set of input data, each of said set of input data being supplied to the first and the second in-out terminals of each of said at least two sets of means for generating a read-out potential for controlling logic of the sense amplifier of each of said at least two sets of means for generating a read-out potential in accordance with said parallel binary input data.

2. A multi-valued semiconductor memory device having a plurality of bit-memory units recited in claim 1 wherein;

said first and said second bit-lines are pre-charged with a potential of a middle reference voltage by a pre-charge circuit when a pre-charge control signal is at high level;

an electrode of said memory capacitor is connected to said middle reference voltage and the other electrode of said memory capacitor is connected through a transistor to one of said first and said second bit-line when said word-line is at high level;

said differential potential is transferred through said data transfer control circuit to each of said at least two sets of means for generating a read-out potential when a first and one of a second and a third transfer control signals are at high level after said word-line is turned to high level, said second transfer control signal being at high level in case said memory capacitor is connected to said first bit-line and said third transfer control signal being at high level in case said memory capacitor is connected to said second bit-line;

said potential shift control signal is turned to high level after said at least two sets of means for generating a read-out potential are separated from said first and said second bit-lines by turning said first and said one of said second and said third transfer control signals to low level;

said second transfer control signal is turned to high level in case said memory capacitor is connected to said first bit-line while said third transfer control signal is turned to high level in case said memory capacitor is connected to said second bit-line for controlling said data transfer control circuit for recharging said memory capacitor after the sense amplifiers of said at least two sets of means for generating a read-out potential are activated; and a write potential for recharging said memory capacitor is obtained by unifying two potentials of said first and said second bit-lines after said first and said second bit-lines are separated from said at least two sets of means for generating a read-out potential by said data transfer control circuit by turning one at high level of said second and said third transfer control signals to low level.

3. A multi-valued semiconductor memory device having a plurality of bit-memory units recited in claim 2 wherein;

said middle reference voltage has a half of a potential of a source voltage;

said memory capacitor stores a charge of one of a first potential same as the potential of said source voltage, a second potential of two third of said first potential, a third potential of a third of said first potential and a fourth potential of 0 V;

said at least two sets of means for generating a read-out potential are composed of first, second and third means for generating a read-out potential, said second and said third means for generating a read-out potential having a first and a second potential shift capacitors respectively;

said first potential shift capacitor shifts the potential of the first in-out terminal of said second means for generating a read-out potential to lower side by a fixed value of one third of a difference between a maximum potential and a minimum potential to be transferred from said first bit-line, while said second potential shift capacitor shifts the potential of said second in-out terminal of said third means for generating a read-out potential to lower side by said fixed value, when said potential shift control signal is turned to low level; and said sense amplifier of said first means for generating a read-out potential is activated by a first positive sense amplifier activating signal having a potential same as said first potential and a first negative sense amplifier activating signal having a potential same as said fourth potential, while said sense amplifier of said second means for generating a read-out potential is activated by a second positive sense amplifier activating signal having a potential same as said first potential and a second negative sense amplifier activating signal having a potential same as said third potential, and said sense amplifier of said third means for generating a read-out potential is activated by a third positive sense amplifier activating signal having a potential same as said second potential and a third negative sense amplifier activating signal having a potential same as said fourth potential.

4. A multi-valued semiconductor memory device having a plurality of bit-memory units recited in claim I wherein;

said first and said second bit-lines are pre-charged with a potential of a middle reference voltage by a pre-charge circuit when a pre-charge control signal is at high level;

a first electrode of said memory capacitor is connected through a transistor to said first bit-line when said word-line is at high level and a second electrode of said memory capacitor is connected through another transistor to said second bit-line when said word-line is at high level;

said differential potential is transferred to each of said at least two sets of means for generating a read-out potential through said data transfer control circuit when a first and a second transfer control signals are at high level after said word-line is turned to high level;

said potential shift control signal is turned to high level after said at least two sets of means for generating a read-out potential are separated from said first and said second bit-lines by turning said first and said second transfer control signals to low level;

said second transfer control signal is turned to high level for controlling said data transfer control circuit for recharging said memory capacitor after the sense amplifiers of said at least two sets of means for generating a read-out potential are activated; and a first write potential for recharging said first electrode is obtained from a potential of said first bit-line and a second write potential for recharging said second electrode is obtained from a potential of said second bit-line.

5. A multi-valued semiconductor memory device having a plurality of bit-memory units recited in claim 4 wherein;

said middle reference voltage has a half of a potential of a source voltage;

said first electrode stores a charge of one of a first potential same as the potential of said source voltage and a fourth potential of 0 V while said second electrode stores a charge of one of a second potential same as two third of said first potential and said fourth potential when said first electrode is charged at said first potential and a charge of one of said first potential and a third potential same as one third of said first potential when said first electrode is charged at said fourth potential;

said at least two sets of means for generating a read-out potential are composed of first, second and third means for generating a read-out potential, said second and said third means for generating a read-out potential having a first and a second potential shift capacitors respectively;

said first potential shift capacitor shifts the potential of the first in-out terminal of said second means for generating a read-out potential to lower side by a fixed value of two third of a difference between a maximum potential and a minimum potential to be transferred from said first bit-line, while said second potential shift capacitor shifts the potential of said second in-out terminal of said third means for generating a read-out potential to lower side by said fixed value, when said potential shift control signal is turned to low level; and said sense amplifier of said first means for generating a read-out potential is activated by a first positive sense amplifier activating signal having a potential same as said first potential and a first negative sense amplifier activating signal having a potential same as said fourth potential, while said sense amplifier of said second means for generating a read-out potential is activated by a second positive sense amplifier activating signal having a potential same as said second potential and a second negative sense amplifier activating signal having a potential same as said fourth potential, and said sense amplifier of said third means for generating a read-out potential is activated by a third positive sense amplifier activating signal having a potential same as said first potential and a third negative sense amplifier activating signal having a potential same as said third potential.

* * * * *

UNITED STATES PATENT AND TRADEMARK OFFICE
CERTIFICATE OF CORRECTION

PATENT NO.   : 5,610,855
DATED        : March 11, 1997
INVENTOR(S)  : Toshio KOMURO It is certified that error appears in the above-indentified patent and that said Letters Patent is hereby corrected as shown below:

Column 1,  line 20,   delete "third example)." and insert --second example), and No. 196791/'89 (to be called a third example).--

Column 7,  line 27,   delete "B 11" and insert --B11--;
           line 36,   delete "DIB" and insert --D1B--;
           line 40,   delete "DIB" and insert --D1B--;
           line 56,   delete "B 11" and insert --B11--.

Column 8,  line 11,   delete "B 11" and insert --B11--.

Column 9,  line 39,   delete "B 11" and insert --B11--.

Column 14, line 3,    after "case" insert --ß--;
           line 39,   delete "5" and insert --δ--.

Column 15, line 49,   before "(B)" insert --18--.

Signed and Sealed this

Second Day of September, 1997

Attest:

BRUCE LEHMAN

*Attesting Officer*    *Commissioner of Patents and Trademarks*